(12) United States Patent
Kurokawa et al.

(10) Patent No.: US 12,009,273 B2
(45) Date of Patent: Jun. 11, 2024

(54) SEMICONDUCTOR APPARATUS INCLUDING DIFFERENT THERMAL RESISTANCE VALUES FOR DIFFERENT HEAT TRANSFER PATHS

(71) Applicant: Murata Manufacturing Co., Ltd., Kyoto-fu (JP)

(72) Inventors: Atsushi Kurokawa, Nagaokakyo (JP); Koshi Himeda, Nagaokakyo (JP); Kazuya Kobayashi, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 55 days.

(21) Appl. No.: 16/749,886

(22) Filed: Jan. 22, 2020

(65) Prior Publication Data
US 2020/0235026 A1    Jul. 23, 2020

(30) Foreign Application Priority Data

Jan. 23, 2019 (JP) .................................. 2019-009220

(51) Int. Cl.
*H01L 23/367* (2006.01)
*H01L 23/00* (2006.01)
(Continued)

(52) U.S. Cl.
CPC .......... *H01L 23/367* (2013.01); *H01L 23/528* (2013.01); *H01L 24/13* (2013.01); *H01L 27/0207* (2013.01); *H01L 27/082* (2013.01); *H01L 29/0817* (2013.01); *H01L 29/0821* (2013.01); *H01L 29/1004* (2013.01); *H01L 29/165* (2013.01); *H01L 29/205* (2013.01);
(Continued)

(58) Field of Classification Search
CPC . H01L 23/367; H01L 237/0211; H01L 27/082
See application file for complete search history.

(56) References Cited

U.S. PATENT DOCUMENTS

| 7,576,406 B2* | 8/2009 | Tamaki | H01L 27/0823 257/E29.171 |
| 8,004,013 B2* | 8/2011 | Petti | H01L 27/1022 257/584 |

(Continued)

FOREIGN PATENT DOCUMENTS

JP    2016-103540 A    6/2016

*Primary Examiner* — Kretelia Graham
*Assistant Examiner* — Diana C Vieira
(74) *Attorney, Agent, or Firm* — Studebaker & Brackett PC

(57) ABSTRACT

A semiconductor apparatus includes a substrate, plural transistor groups disposed on the substrate, an insulating film, and a metal member. Each of the plural transistor groups includes plural unit transistors arranged in a first direction within a plane of a top surface of the substrate. The plural transistor groups are arranged in a second direction perpendicular to the first direction. The insulating film covers the plural unit transistors and includes at least one cavity. The metal member is disposed on the insulating film and is electrically connected to the plural unit transistors via the at least one cavity. A heat transfer path is formed by a metal in a region from each of the plural unit transistors to a top surface of the metal member. Thermal resistance values of the heat transfer paths are different from each other among the plural unit transistors.

22 Claims, 11 Drawing Sheets

(51) Int. Cl.
  *H01L 23/528* (2006.01)
  *H01L 27/02* (2006.01)
  *H01L 27/082* (2006.01)
  *H01L 29/08* (2006.01)
  *H01L 29/10* (2006.01)
  *H01L 29/165* (2006.01)
  *H01L 29/205* (2006.01)
  *H01L 29/417* (2006.01)
  *H01L 29/423* (2006.01)
  *H01L 29/45* (2006.01)
  *H01L 29/737* (2006.01)

(52) U.S. Cl.
  CPC .. *H01L 29/41708* (2013.01); *H01L 29/42304* (2013.01); *H01L 29/452* (2013.01); *H01L 29/7371* (2013.01)

(56) References Cited

U.S. PATENT DOCUMENTS

| | | | |
|---|---|---|---|
| 8,018,006 B2* | 9/2011 | Arai | H01L 29/732 |
| | | | 257/374 |
| 9,224,635 B2* | 12/2015 | Pellizzer | H01L 27/0207 |
| 2010/0314712 A1 | 12/2010 | Arai et al. | |
| 2018/0331009 A1* | 11/2018 | Wang | H01L 27/1203 |

* cited by examiner

SEMICONDUCTOR APPARATUS INCLUDING DIFFERENT THERMAL RESISTANCE VALUES FOR DIFFERENT HEAT TRANSFER PATHS

CROSS-REFERENCE TO RELATED APPLICATION

This application claims benefit of priority to Japanese Patent Application No. 2019-009220, filed Jan. 23, 2019, the entire content of which is incorporated herein by reference.

BACKGROUND

Technical Field

The present disclosure relates to a semiconductor apparatus.

Background Art

A heterojunction bipolar transistor (HBT) is used in a power amplifier module of a mobile terminal, for example. Japanese Unexamined Patent Application Publication No. 2016-103540 discloses an HBT which is able to reduce the thermal resistance. The HBT includes plural unit transistors connected in parallel with each other and arranged in a first direction and a bump electrically connected to the emitters of the plural unit transistors. The bump is disposed over the emitters of the plural unit transistors so as to extend in the first direction.

SUMMARY

When the parallel-connected plural unit transistors are operated, the temperature may rise differently among the unit transistors. Unit transistors where the temperature is more likely to become high are degraded more quickly than the other unit transistors, and the life of the overall semiconductor apparatus becomes short. Such temperature variations among the operating unit transistors also impair the characteristics of the HBT device.

Therefore, the present disclosure provides a semiconductor apparatus that is able to reduce temperature variations among plural unit transistors during their operation.

According to an aspect of the present disclosure, there is provided a semiconductor apparatus including a substrate, plural transistor groups disposed on the substrate, an insulating film, and a metal member. Each of the plural transistor groups includes plural unit transistors arranged in a first direction within a plane of a top surface of the substrate. The plural transistor groups are arranged in a second direction perpendicular to the first direction. The insulating film covers the plural unit transistors and includes at least one cavity. The metal member is disposed on the insulating film and is electrically connected to the plural unit transistors via the at least one cavity. A heat transfer path is formed by a metal in a region from each of the plural unit transistors to a top surface of the metal member. Thermal resistance values of the heat transfer paths are different from each other among the plural unit transistors.

When the plural unit transistors are operated, the temperature rises differently among the unit transistors. The thermal resistance values of the heat transfer paths are made different from each other among the plural unit transistors, thereby making it possible to reduce temperature variations in the unit transistors. For example, if the thermal resistance value of a heat transfer path corresponding to a unit transistor where the temperature is more likely to become high is set to be relatively low, the temperature variations can be reduced.

Other features, elements, characteristics and advantages of the present disclosure will become more apparent from the following detailed description of preferred embodiments of the present disclosure with reference to the attached drawings.

DETAILED DESCRIPTION

First Embodiment

A semiconductor apparatus according to a first embodiment will be described below with reference to FIGS. 1, 2A, and 2B.

Figure 1:
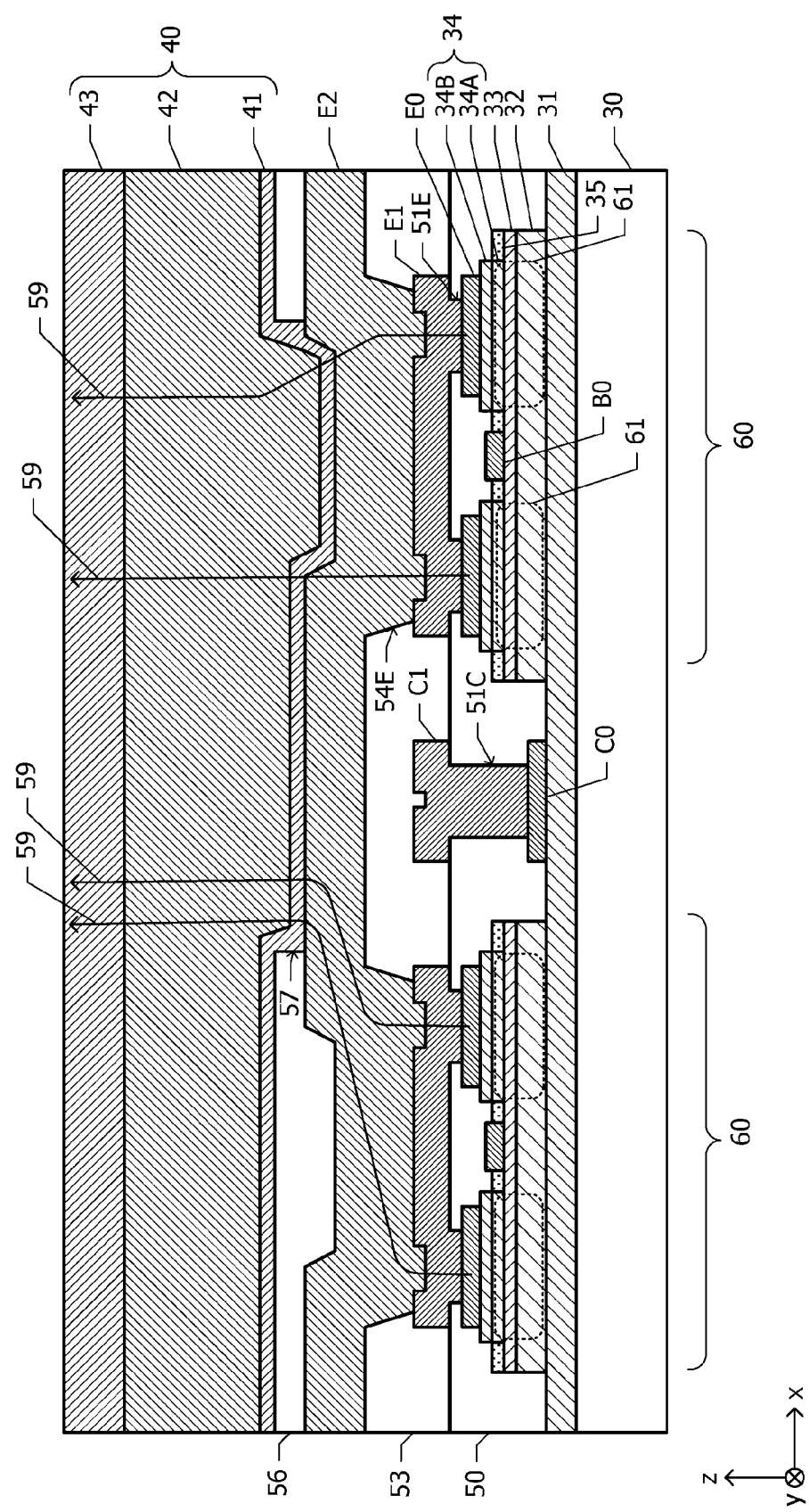
FIG. 1 is a sectional view illustrating part of a semiconductor apparatus according to a first embodiment.

FIG. 1 is a sectional view illustrating part of the semiconductor apparatus according to the first embodiment. A sub-collector layer 31 made of high-concentration n-type GaAs is formed on a substrate 30 made of semi-insulating GaAs. The thickness of the sub-collector layer 31 is about 0.5 μm.

Plural multilayer structures, each of which is constituted by a collector layer 32 and a base layer 33, are disposed on part of the sub-collector layer 31. The collector layer 32 is formed of n-type GaAs, for example, and has a thickness of about 1 μm. The base layer 33 is formed of p-type GaAs, for example, and has a thickness of about 100 nm.

An emitter layer 34 is disposed at two regions on the top surface of the base layer 33 of each multilayer structure. Each emitter layer 34 includes an intrinsic emitter layer 34A and an emitter mesa layer 34B in this order from the bottom. The intrinsic emitter layer 34A is formed of n-type InGaP, for example, and has a thickness of about 30 to 40 nm. The emitter mesa layer 34B includes a high-concentration n-type GaAs layer having a thickness of about 100 nm and a high-concentration n-type InGaAs layer having a thickness of about 100 nm in this order from the bottom.

The top surface of the base layer 33 without the emitter layer 34 is covered with a ledge layer 35. The ledge layer 35 is deposited together with the intrinsic emitter layer 34A and has the same composition as the intrinsic emitter layer 34A. Without the emitter mesa layer 34B on the ledge layer 35, the ledge layer 35 is depleted and does not serve as the emitter of a transistor. In this specification, the emitter layer 34 only includes the intrinsic emitter layer 34A and the emitter mesa layer 34B and excludes the ledge layer 35.

The collector layer 32, the base layer 33, and the emitter layers 34 form a unit transistor 60. The semiconductor apparatus of the first embodiment includes plural unit transistors 60 connected in parallel with each other. Each of the plural unit transistors 60 is a heterojunction bipolar transistor. The plural unit transistors 60 are arranged side by side in a first direction in the plane of the top surface of the substrate 30. An xyz rectangular coordinate system is defined. In this coordinate system, the first direction is set as the x-axis direction, a second direction perpendicular to the first direction in the plane of the top surface of the substrate 30 is set as the y-axis direction, and a direction normal to the top surface of the substrate 30 is set as the z-axis direction. The two emitter layers 34 within one unit transistor 60 are arranged separately from each other in the x-axis direction.

Collector electrodes C0 are disposed on the sub-collector layer 31 and ohmic-contacts the sub-collector layer 31. A collector electrode C0 is disposed between two unit transistors 60 adjacent to each other in the x-axis direction. Collector electrodes C0 are also disposed outward of the unit transistors 60 located at both ends in the x-axis direction. The collector electrodes C0 are connected to the collector layers 32 via the sub-collector layer 31.

A base electrode B0 ohmic-contacts the base layer 33 through a cavity formed in the ledge layer 35. The base electrode B0 is disposed between the two emitter layers 34 within one unit transistor 60. An emitter electrode E0 is disposed on each emitter mesa layer 34B and ohmic-contacts the emitter layer 34.

The collector electrodes C0 are constituted by an AuGe film, a Ni film, and an Au film sequentially stacked on each other on the sub-collector layer 31 in this order. The base electrodes B0 are constituted by a Ti film, a Pt film, and an Au film sequentially stacked on each other on the base layers 33 in this order. The emitter electrodes E0 are constituted by a Ti film having a thickness of about 50 nm, for example.

In the area of the sub-collector layer 31 which is not shown in FIG. 1, an isolation region is formed to isolate devices from each other. The isolation region is formed by insulating part of the sub-collector layer 31 by using ion implantation, for example.

A first-layer insulating film 50 is disposed to cover the sub-collector layer 31, the unit transistors 60, the collector electrodes C0, the base electrodes B0, and the emitter electrodes E0. The first-layer insulating film 50 has a multilayer structure of a SiN film and a resin film, for example. The first-layer insulating film 50 may be constituted only by a SiN film.

On the first-layer insulating film 50, first-layer emitter wirings E1 and first-layer collector wirings C1 are disposed. Each first-layer emitter wiring E1 is connected to the emitter electrodes E0 via first emitter cavities 51E formed in the first-layer insulating film 50. The first-layer emitter wiring E1 is provided for each unit transistor 60 and connects the two emitter electrodes E0 in each unit transistor 60. Each first-layer collector wiring C1 is connected to the collector electrode C0 via a first collector cavity 51C formed in the first-layer insulating film 50. The first-layer emitter wirings E1 and the first-layer collector wirings C1 each have a multilayer structure of a Ti film having a thickness of about 10 to 50 nm and an Au film having a thickness of about 1 to 2 μm.

A second-layer insulating film 53 is formed on the first-layer insulating film 50 to cover the first-layer emitter wirings E1 and the first-layer collector wirings C1. The second-layer insulating film 53 has a multilayer structure of a SiN film and a resin film. The second-layer insulating film 53 may be constituted only by a SiN film.

A second-layer emitter wiring E2 is disposed on the second-layer insulating film 53. The second-layer emitter wiring E2 is connected to the first-layer emitter wirings E1 via second emitter cavities 54E formed in the second-layer insulating film 53. The first-layer emitter wirings E1 corresponding to the respective unit transistors 60 disposed in the x-axis direction are connected to each other via the second-layer emitter wiring E2. The second-layer emitter wiring E2 has a multilayer structure of a Ti film having a thickness of about 10 to 50 nm and an Au film having a thickness of about 2 to 4 μm.

A third-layer insulating film 56 is formed over the second-layer insulating film 53 to cover the second-layer emitter wiring E2. The third-layer insulating film 56 has a multilayer structure of a SiN film and a resin film, for example. The third-layer insulating film 56 may be constituted only by a SiN film. The third-layer insulating film 56 serves as a protection film for protecting the unit transistors 60 and other elements.

Third cavities 57 are formed in the third-layer insulating film 56. The third cavities 57 are located within the second-layer emitter wiring E2 as viewed from above.

A bump 40 is disposed on the third-layer insulating film 56 and is connected to the second-layer emitter wiring E2 through the third cavities 57. The bump 40 has a multilayer structure constituted by an under bump metal layer 41, a metal post 42, and a solder layer 43 stacked on each other in this order from the bottom. A Ti film having a thickness of about 50 to 100 nm, for example, is used for the under bump metal layer 41. The under bump metal layer 41 serves to enhance the adhesiveness of the bump 40 to the third-layer insulating film 56, which is an underlayer. A Cu film having a thickness of about 30 to 50 μm, for example, is used as the metal post 42. The solder layer 43 is made of Sn or a SnAg alloy having a thickness of about 10 to 30 μm, for example. A mutual-diffusion-preventing barrier metal layer made of Ni, for example, may be disposed between the metal post 42 and the solder layer 43. The bump 40 serves as a metal member for dissipating heat generated in the unit transistors 60 to the outside.

In each unit transistor 60, an operating current flows from the collector layer 32 to the emitter layer 34 via the base layer 33. Portions of the emitter layer 34, the base layer 33, and the collector layer 32 where the operating current substantially flows will be called an operating region 61. The operating region 61 substantially matches the emitter layer 34 as viewed from above. Two emitter layers 34 are disposed in each unit transistor 60, and two operating regions 61 are accordingly defined in each unit transistor 60. Joule heating occurs as a result of the operating current flowing through the operating region 61.

A heat transfer path 59 is formed in a region from each emitter layer 34 of each unit transistor 60 to the top surface of the bump 40. The heat transfer path 59 is formed by a metal constituted by the emitter electrode E0, the first-layer emitter wiring E1, the second-layer emitter wiring E2, and the bump 40. The thermal resistance of each heat transfer path 59 is determined by the length and the sectional area of the heat transfer path 59. If the third cavity 57 is formed immediately above the operating region 61, the thermal resistance of the corresponding heat transfer path 59 is relatively low. If the third cavity 57 is displaced from the operating region 61 in the horizontal direction, the thermal resistance of the corresponding heat transfer path 59 is relatively high. In this manner, the thermal resistance of the heat transfer path 59 is determined by the positional relationship between the operating region 61 and the third cavity 57 as viewed from above. In other words, if the positional relationship between the operating region 61 and the third cavity 57 as viewed from above is different among the heat transfer paths 59, the thermal resistances of these heat transfer paths 59 are different.

Figure 2A:
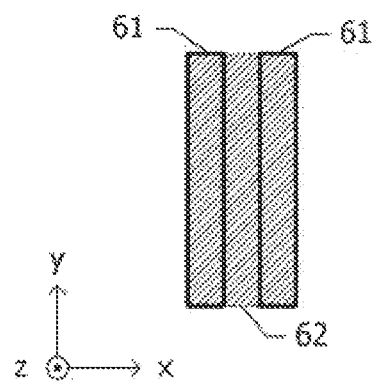
FIG. 2A is a plan view illustrating the positional relationship between two operating regions within one unit transistor.

FIG. 2A is a plan view illustrating the positional relationship between two operating regions 61 within one unit transistor 60. The two operating regions 61 each have a planar shape elongated in the y-axis direction as viewed from above, and are disposed separately from each other in the x-axis direction. The smallest rectangle containing two operating regions 61 and having a pair of sides parallel with the x-axis direction as viewed from above is defined as an effective operating region 62. In FIG. 2A, the effective operating region 62 is indicated by the hatched portion.

Usually, the interval between the two operating regions 61 within one unit transistor 60 is much smaller than the length in the y-axis direction. Hence, the effective operating region 62 substantially matches the major region where heat is generated and the temperature becomes high when the unit transistor 60 is operated. Simulations are conducted to measure the temperature distribution when the unit transistor 60 is operated. The simulations show that the temperatures of the two operating regions 61 are almost the same and the temperature of the substantially entirety of the effective operating region 62 becomes high.

If three or more emitter layers 34 (FIG. 1) are disposed within one unit transistor 60, three or more operating regions 61 are accordingly disposed within one unit transistor 60. In this case, the smallest rectangle containing three or more operating regions 61 and having a pair of sides parallel with the x-axis direction as viewed from above is defined as an effective operating region 62.

Figure 2B:
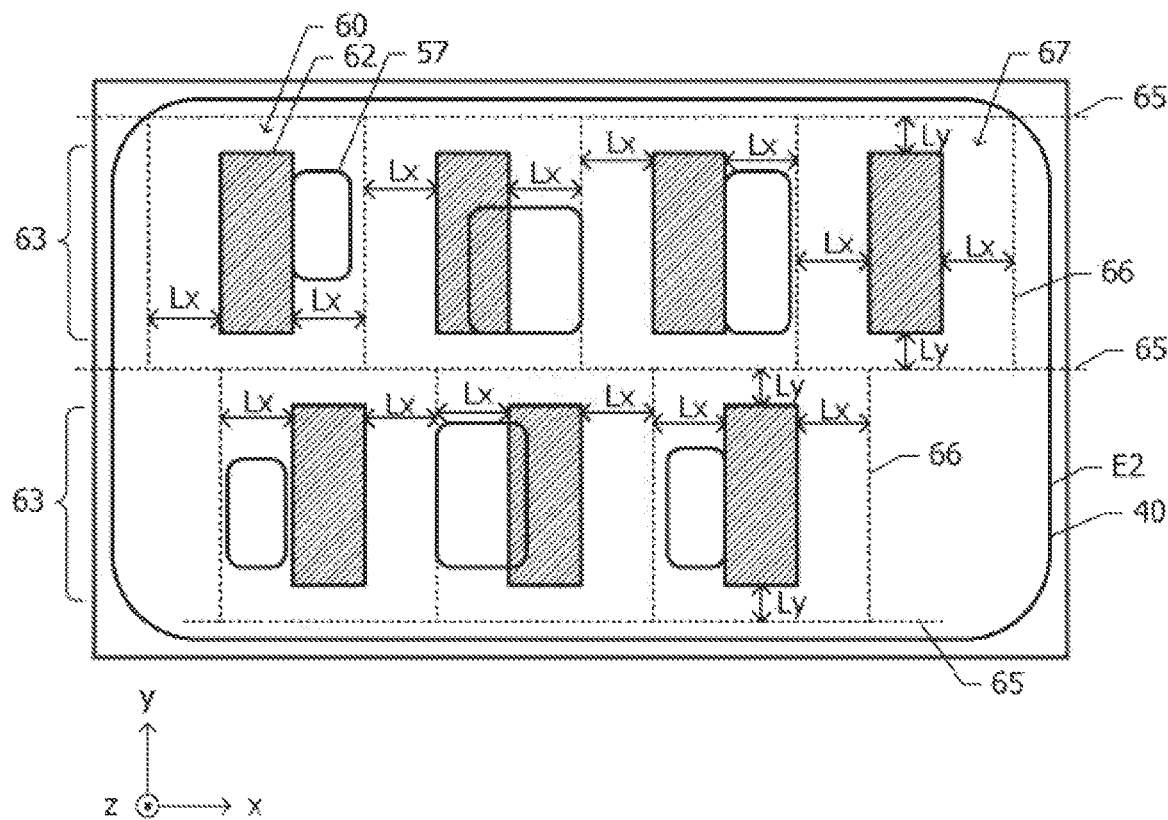
FIG. 2B is a plan view illustrating the positional relationships among plural unit transistors, plural effective operating regions, a second-layer emitter wiring, a bump, and third cavities.

FIG. 2B is a plan view illustrating the positional relationships among plural unit transistors 60, plural effective operating regions 62, the second-layer emitter wiring E2, the bump 40, and the third cavities 57. Plural unit transistors 60 arranged in the x-axis direction form a transistor group 63. The semiconductor apparatus of the first embodiment includes multiple transistor groups 63. The multiple transistor groups 63 are disposed side by side in the y-axis direction. The semiconductor apparatus of the first embodiment includes two transistor groups 63. One transistor group 63 includes four unit transistors 60, and the other transistor group 63 includes three unit transistors 60.

The effective operating regions 62 of the plural unit transistors 60 are disposed within the second-layer emitter wiring E2 and the bump 40, as viewed from above. The effective operating regions 62 are indicated by the hatched portions in FIG. 2B. In the first embodiment, the plural effective operating regions 62 have the same shape and the same dimensions. The plural effective operating regions 62 of the same transistor group 63 are disposed at the same position in the y-axis direction. A range adjacent to an effective operating region 62 and also overlapping the bump 40 as viewed from above, that is, a range by which heat generated from the effective operating region 62 of each unit transistor 60 can effectively be dissipated outside (hereinafter such a range will be called a heat-dissipating range 67), is defined for each effective operating region 62 in the following manner.

Plural first boundary lines 65 are defined. More specifically, a first boundary line 65 between multiple transistor groups 63 and first boundary lines 65 positioned outward of the outermost transistor groups 63 in the y-axis direction are defined. The first boundary lines 65 are each parallel with the x-axis direction. The first boundary line 65 between multiple transistor groups 63 is defined at a position at which the distance Ly from the first boundary line 65 to each of the plural effective operating regions 62 of one transistor group 63 becomes equal to the distance Ly from the first boundary line 65 to each the plural effective operating regions 62 of the other transistor group 63. The outermost first boundary lines 65 are each defined at a position at which the distance Ly from the outermost first boundary line 65 to each of the plural effective operating regions 62 of the outermost transistor group 63 becomes equal to the distance Ly from the first boundary line 65 positioned one line inward from the outermost first boundary line 65 to each of the plural effective operating regions 62 of the outermost transistor group 63.

Plural second boundary lines 66 are defined. More specifically, for each transistor group 63, a second boundary line 66 between two adjacent unit transistors 60 in the x-axis direction is defined, and second boundary lines 66 positioned outward of the outermost unit transistors 60 in the x-axis direction are defined. The second boundary lines 66 are each parallel with the y-axis direction. The second boundary line 66 between two unit transistors 60 is defined at a position at which the distance Lx from the second boundary line 66 to the effective operating region 62 of one unit transistor 60 becomes equal to the distance Lx from the second boundary line 66 to the effective operating region 62 of the other unit transistor 60. For each transistor group 63, the outermost second boundary lines 66 are each defined at a position at which the distance Lx from the effective operating region 62 of the outermost unit transistor 60 to the outermost second boundary line 66 becomes equal to that from the effective operating region 62 of the outermost unit transistor 60 to another second boundary line 66 adjacent to the outermost second boundary line 66.

The first boundary lines 65 and the second boundary lines 66 form multiple sections. The region where the bump 40 (metal member) overlaps each of the multiple sections is defined as a heat-dissipating range 67 of the effective operating region 62 within the corresponding section.

The plural third cavities 57 are located within the second-layer emitter wiring E2 as viewed from above. In at least one pair of two heat-dissipating ranges 67 adjacent to each other at the first boundary line 65 in the y-axis direction, the area by which one heat-dissipating range 67 overlaps the corresponding third cavity 57 is different from that by which the other heat-dissipating range 67 overlaps the corresponding third cavity 57. For example, in the first embodiment shown in FIG. 2B, the second heat-dissipating range 67 from the left in the first row is adjacent to the first and second heat-dissipating ranges 67 from the left in the second row in the y-axis direction. The second heat-dissipating range 67 from the left in the first row and the first heat-dissipating range 67 from the left in the second row form one pair. The second heat-dissipating range 67 from the left in the first row and the second heat-dissipating range 67 from the left in the second row form another pair. In this manner, typically, one heat-dissipating range 67 forms multiple pairs with other heat-dissipating ranges 67.

Within the same transistor group 63, the area by which the heat-dissipating range 67 overlaps the corresponding third cavity 57 is different among the heat-dissipating ranges 67.

Advantages of the first embodiment will be discussed below.

Heat generated in an effective operating region 62 is largely conducted to the top surface of the bump 40 via the corresponding third cavity 57 positioned within the heat-dissipating range 67 of this effective operating region 62, and is dissipated outside. The area by which the heat-dissipating range 67 overlaps the third cavity 57 is different among the heat-dissipating ranges 67. Hence, the thermal resistance of the heat transfer path 59 (FIG. 1) also becomes different among the effective operating regions 62. Among the plural effective operating regions 62, for an effective operating region 62 where the temperature is more likely to become high, the thermal resistance of the heat transfer path 59 corresponding to this effective operating region 62 is set to be relatively low. This can reduce the temperature variations among the effective operating regions 62. For example, for an effective operating region 62 where the temperature is more likely to become high, the area by which the heat-dissipating range 67 of this effective operating region 62 overlaps the third cavity 57 is made relatively large.

In the first embodiment, four unit transistors 60 are disposed in the transistor group 63 in the first row, while three unit transistors 60 are disposed in the transistor group 63 in the second row. Fewer unit transistors 60 are disposed in the transistor group 63 where the temperature is more likely to become high. This can make the temperatures of the effective operating regions 62 substantially uniform.

For example, in FIG. 2B, if a heating source other than the unit transistors 60 is located in the vicinity of the transistor group 63 in the second row, the temperature of the effective operating regions 62 of this transistor group 63 is more likely to become high than that in the first row. As a result of disposing fewer transistors 60 in the transistor group 63 where the temperature is more likely to become high, temperature variations among the transistor groups 63 can be compensated for, thereby reducing temperature variations among the effective operating regions 62.

If the impedance of the unit transistors 60 is different among the transistor groups 63, the amount of heat generated in the unit transistors 60 under the high-frequency operation becomes different among the transistor groups 63. In this case, too, the number of unit transistors 60 disposed in the transistor group 63 is varied among the transistor groups 63, thereby making it possible to reduce variations in the temperatures of the effective operating regions 62 among the transistor groups 63.

Modified examples of the first embodiment will be described below.

Although in the first embodiment the two transistor groups 63 are arranged, three or more transistor groups 63 may be disposed. In the first embodiment, the transistor group 63 in the first row includes four unit transistors 60, while the transistor group 63 in the second row includes three unit transistors 60. However, the number of unit transistors 60 is not limited to these numbers. Additionally, the same number of unit transistors 60 may be included in the multiple transistor groups 63.

In the first embodiment, the area by which the heat-dissipating range 67 of the effective operating region 62 overlaps the third cavity 57 is different among the effective operating regions 62. Alternatively, the area of the heat-dissipating range 67 itself may be made different among the effective operating regions 62. For example, the area of the heat-dissipating range 67 of the effective operating region 62 where the temperature is more likely to become high may be made relatively large. The area by which the heat-dissipating range 67 of the effective operating region 62 overlaps the third cavity 57 may be made different among the effective operating regions 62, and also, the area of the heat-dissipating range 67 itself may be made different among the effective operating regions 62.

In the first embodiment, all the plural third cavities 57 (FIG. 2B) are disposed within the corresponding heat-dissipating ranges 67 as viewed from above. Alternatively, one third cavity 57 may be disposed over multiple heat-dissipating ranges 67.

Second Embodiment

A semiconductor apparatus according to a second embodiment will now be described below with reference to FIG. 3. An explanation of the elements configured similarly to those of the semiconductor apparatus according to the first embodiment (FIGS. 1 through 2B) will be omitted.

Figure 3:
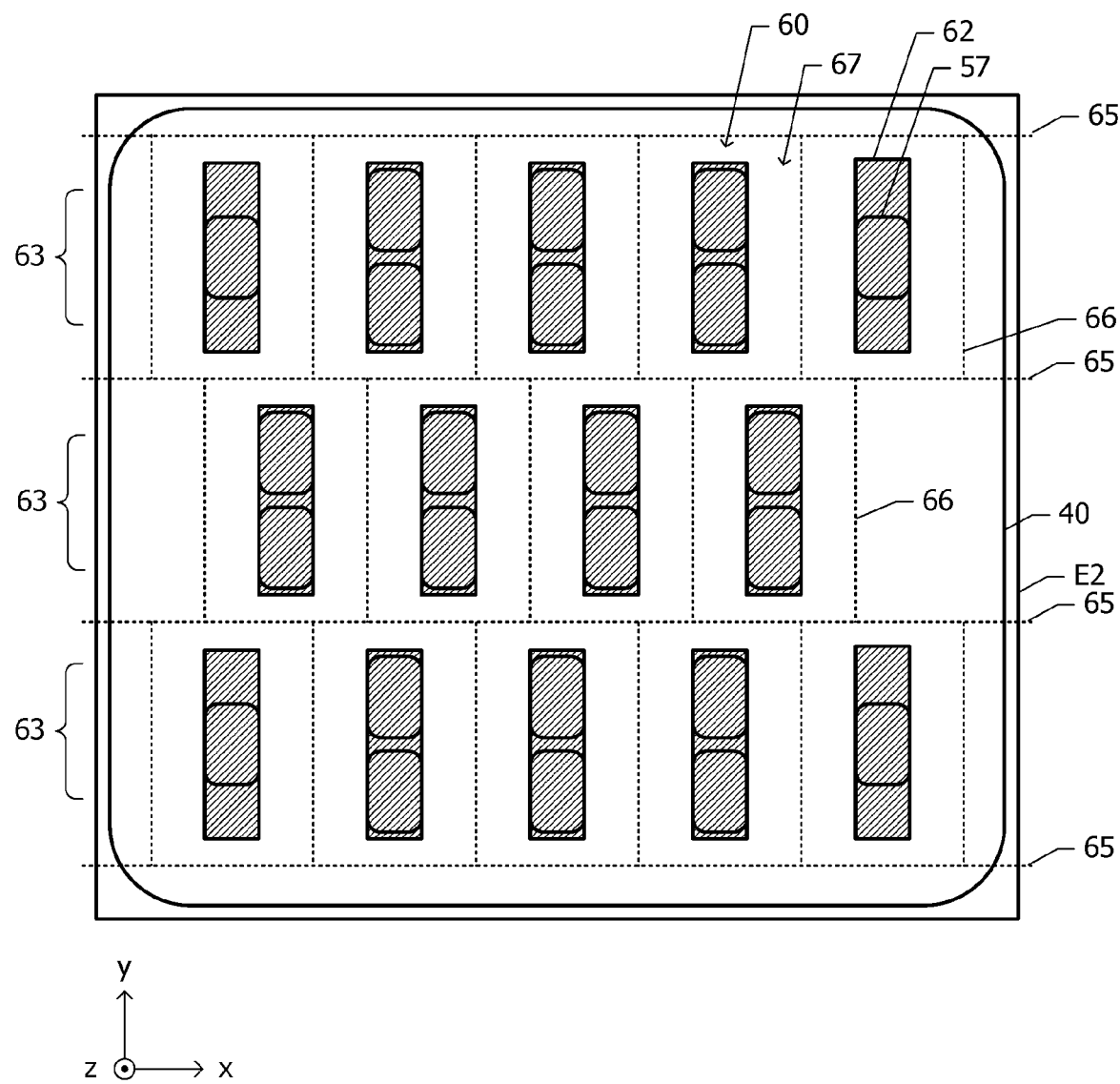
FIG. 3 is a plan view illustrating the positional relationships among plural unit transistors, effective operating regions, heat-dissipating ranges, a second-layer emitter wiring, a bump, and third cavities of a semiconductor apparatus according to a second embodiment.

FIG. 3 is a plan view illustrating the positional relationships among plural unit transistors 60, effective operating regions 62, heat-dissipating ranges 67, a second-layer emitter wiring E2, a bump 40, and third cavities 57 of the semiconductor apparatus according to the second embodiment. In FIG. 3, the effective operating regions 62 are indicated by the hatched portions. In the second embodiment, three transistor groups 63 are arranged in the y-axis direction. The outermost transistor groups 63 (first and third rows) in the y-axis direction each include five unit transistors 60. The transistor group 63 at the center (second row) includes four unit transistors 60.

The areas by which the heat-dissipating ranges 67 overlap the corresponding third cavities 57 are all equal to each other, except for the areas by which the heat-dissipating ranges 67 at both ends of the outermost transistor groups 63 (first and third rows) in the y-axis direction overlap the corresponding third cavities 57. Two third cavities 57 having the same size are disposed within each of these heat-dissipating ranges 67 other than within those at both ends of the outermost transistor groups 63.

Among the heat-dissipating ranges 67 of the outermost transistor groups 63 in the y-axis direction, the areas by which the heat-dissipating ranges 67 at both ends overlap the corresponding third cavities 57 are smaller than the areas by which the other heat-dissipating ranges 67 overlap the corresponding third cavities 57. One third cavity 57 having the same size as the other third cavities 57 is disposed within each of the heat-dissipating ranges 67 at both ends of the outermost transistor groups 63 in the y-axis direction.

Advantages of the second embodiment will be discussed below.

Typically, the effective operating regions 62 located at and around the center of the bump 40 as viewed from above are the area where the temperature is more likely to become high than those at the peripheral areas. In the second embodiment, the central transistor group 63 includes fewer unit transistors 60 than the outermost transistor groups 63. This can reduce temperature variations among the plural effective operating regions 62 in the y-axis direction.

Additionally, focusing on each of the outermost transistor groups 63 in the y-axis direction, the areas by which the heat-dissipating ranges 67 at both ends in the x-axis direction overlap the corresponding third cavities 57 are found to be smaller than the areas by which the other heat-dissipating ranges 67 overlap the corresponding third cavities 57. This can reduce temperature variations among the plural effective operating regions 62 in the x-axis direction.

Modified examples of the second embodiment will be described below.

Although the plural third cavities 57 have the same shape and the same size in the second embodiment, they may have different shapes and different sizes. Additionally, transistor groups 63 in four or more rows may be disposed. In this case, fewer unit transistors 60 are disposed in the transistor groups 63 located relatively inwards in the y-axis direction than those in the transistor groups 63 located relatively outwards in the y-axis direction.

Third Embodiment

A semiconductor apparatus according to a third embodiment will now be described below with reference to FIG. 4. An explanation of the elements configured similarly to those of the semiconductor apparatus according to the first embodiment (FIGS. 1 through 2B) will be omitted.

Figure 4:
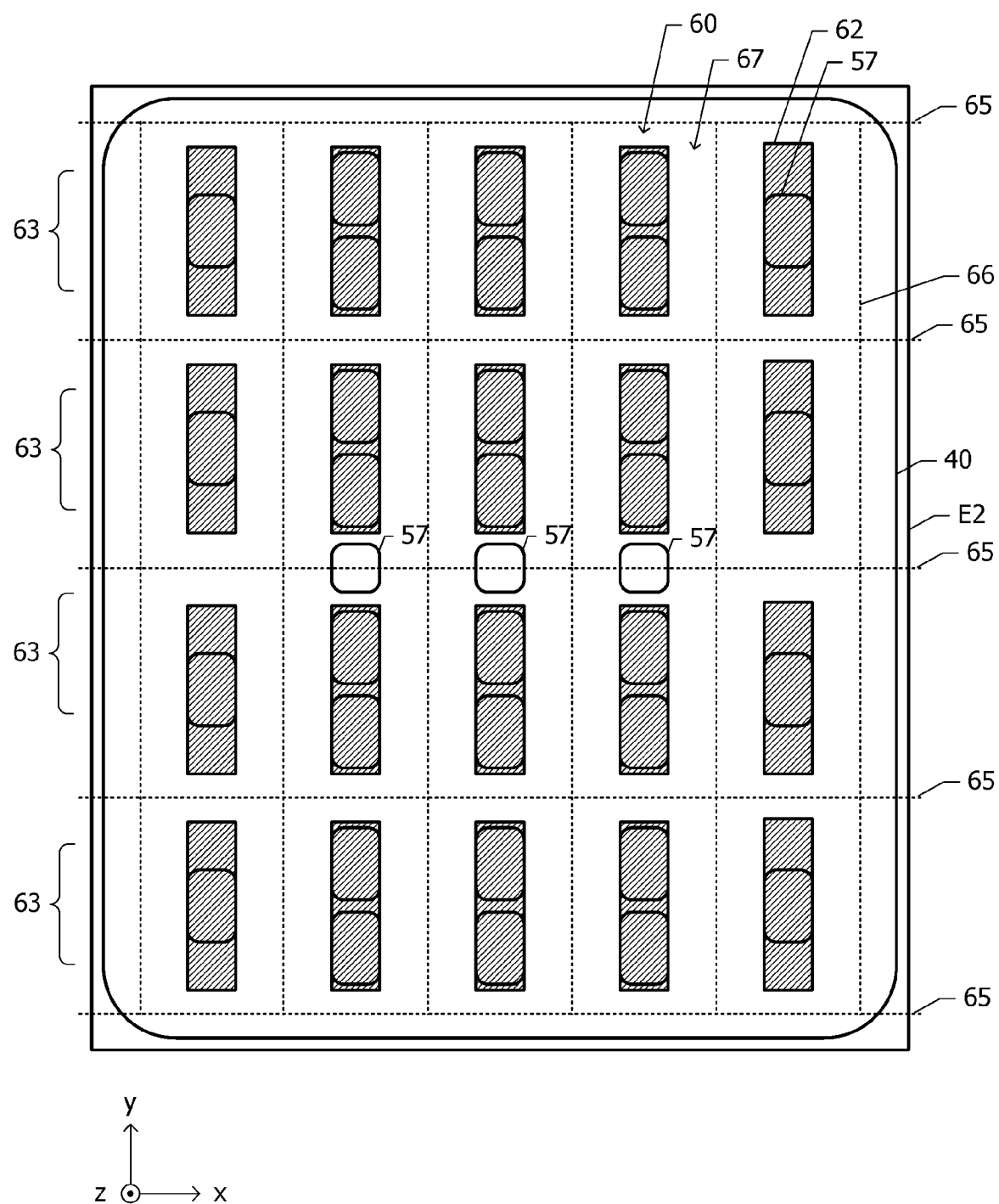
FIG. 4 is a plan view illustrating the positional relationships among plural unit transistors, effective operating regions, heat-dissipating ranges, a second-layer emitter wiring, a bump, and third cavities of a semiconductor apparatus according to a third embodiment.

FIG. 4 is a plan view illustrating the positional relationships among plural unit transistors 60, effective operating regions 62, heat-dissipating ranges 67, a second-layer emitter wiring E2, a bump 40, and third cavities 57 of the semiconductor apparatus according to the third embodiment. In the third embodiment, transistor groups 63 in four rows are arranged in the y-axis direction. The same number of unit transistors 60 is included in all the transistor groups 63. Each transistor group 63 includes five unit transistors 60, for example. The plural unit transistors 60 are aligned in the y-axis direction, as well as in the x-axis direction, and are arranged in a matrix of four rows and five columns, assuming that the row direction is the x-axis direction and the column direction is the y-axis direction.

Three third cavities 57 are disposed so as to overlap the central first boundary line 65. These three third cavities 57 are disposed at positions close to the three inward columns (second, third, and fourth columns) of the effective operating regions 62 arranged in the four-by-five matrix. Focusing on each pair of heat-dissipating ranges 67 adjacent to each other in the y-axis direction, the areas by which the heat-dissipating ranges 67 overlap the corresponding third cavities 57 are found to be equal to each other, on the condition that the three third cavities 57 on the central first boundary line 65 are excluded.

In the third embodiment, the three third cavities 57 are located to overlap the central first boundary line 65, so that the heat-dissipating ranges 67 in the second through four columns in the second and third rows overlap these third cavities 57. Focusing on a pair of each of the heat-dissipating ranges 67 in the second through fourth columns in the first row and the adjacent heat-dissipating range 67 in the second rows, the area by which the heat-dissipating range 67 in the second row overlaps the corresponding third cavities 57 is found to be larger than the area by which the heat-dissipating range 67 in the first row overlaps the corresponding third cavities 57. Concerning the adjacent heat-dissipating ranges 67 in the third and fourth rows, the area by which the heat-dissipating range 67 in the third row overlaps the corresponding third cavities 57 is also larger than the area by which the heat-dissipating range 67 in the fourth row overlaps the corresponding third cavities 57. That is, the areas by which the heat-dissipating ranges 67 of a relatively inward transistor group 63 overlap the corresponding third cavities 57 are larger than the areas by which the heat-dissipating ranges 67 of a relatively outward transistor group 63 overlap the corresponding third cavities 57.

Focusing on the same transistor group 63, the areas by which the heat-dissipating ranges 67 at both ends overlap the corresponding third cavities 57 are found to be smaller than the areas by which the other heat-dissipating ranges 67 overlap the corresponding third cavities 57, as in the transistor groups 63 in the first and third rows in the second embodiment (FIG. 3).

Advantages of the third embodiment will be discussed below.

In the third embodiment, the areas by which the heat-dissipating ranges 67 in the vicinity of the center in the y-axis direction overlap the corresponding third cavities 57 are set to be larger than the areas by which the relatively outward heat-dissipating ranges 67 overlap the corresponding third cavities 57. This improves the heat dissipation characteristics of the central effective operating regions 62, thereby reducing temperature variations among plural effective operating regions 62 in the y-axis direction.

It is also possible to reduce temperature variations among plural effective operating regions 62 in the x-axis direction, as in the second embodiment.

Modified examples of the third embodiment will be described below.

In the third embodiment, third cavities 57 are also disposed on the central first boundary line 65, separately from the other third cavities 57 contained within the effective operating regions 62. These third cavities 57 do not overlap any effective operating regions 62. The third cavities 57 on the central first boundary line 65 may alternatively extend in the y-axis direction to overlap the corresponding effective operating regions 62.

The three third cavities 57 on the central first boundary line 65 may extend in the x-axis direction to be connected with each other to form a single third cavity 57.

Fourth Embodiment

A semiconductor apparatus according to a fourth embodiment will now be described below with reference to FIG. 5. An explanation of the elements configured similarly to those of the semiconductor apparatus according to the third embodiment (FIG. 4) will be omitted.

Figure 5:
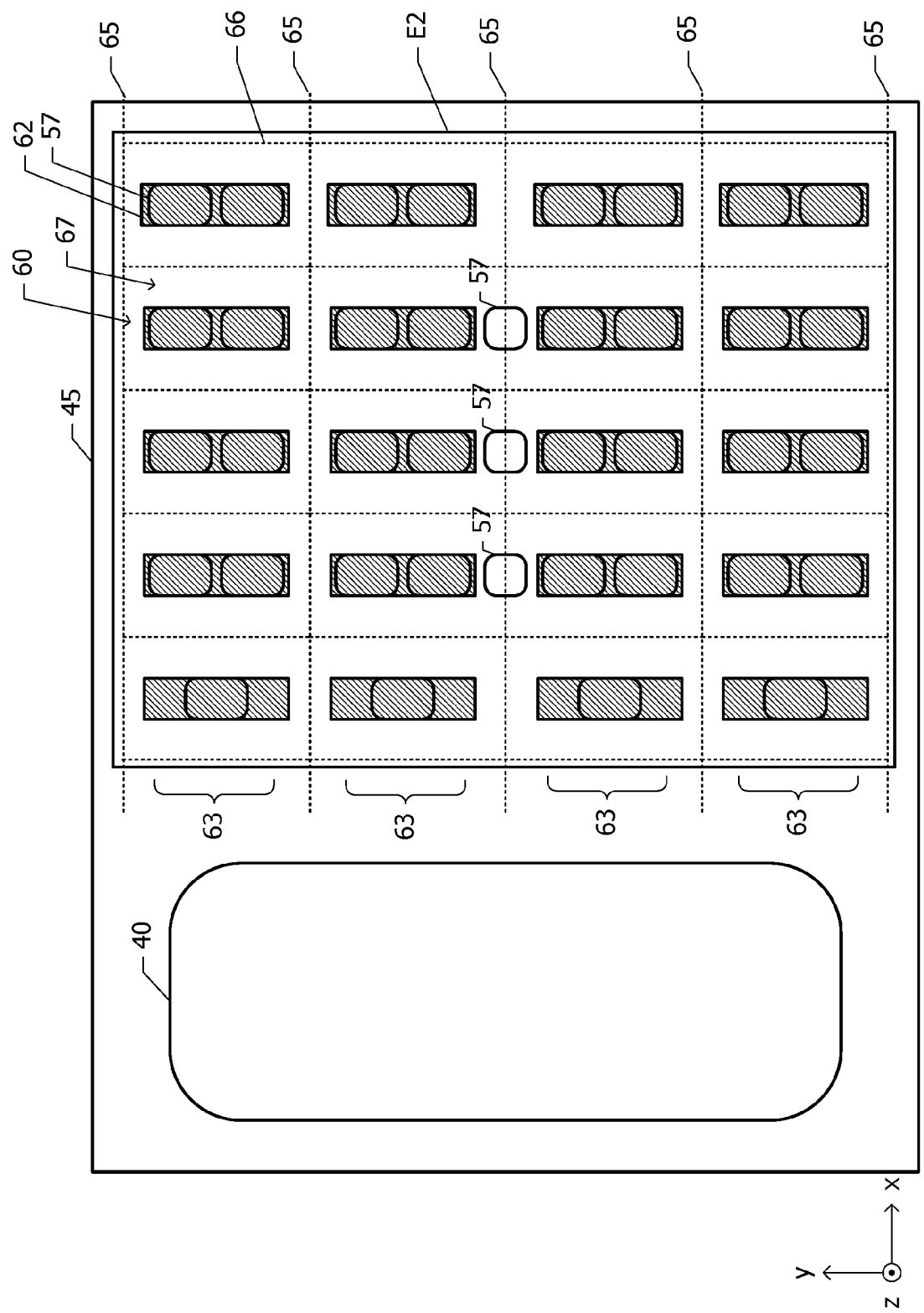
FIG. 5 is a plan view illustrating the positional relationships among plural unit transistors, effective operating regions, heat-dissipating ranges, a second-layer emitter wiring, a bump, and third cavities of a semiconductor apparatus according to a fourth embodiment.

FIG. 5 is a plan view illustrating the positional relationships among plural unit transistors 60, effective operating regions 62, heat-dissipating ranges 67, a second-layer emitter wiring E2, a bump 40, and third cavities 57 of the semiconductor apparatus according to the fourth embodiment. In the third embodiment, the bump 40 (FIG. 4) is located so as to substantially entirely cover the second-layer emitter wiring E2, as viewed from above. In the fourth embodiment, the bump 40 is located at a position at which it does not overlap the second-layer emitter wiring E2. The second-layer emitter wiring E2 and the bump 40 are connected to each other by rewiring 45 made of a metal, such as Cu. "Rewiring" refers to wiring used for rearranging the position of a terminal, such as an external connection bump.

In the fourth embodiment, the rewiring 45 is connected to the unit transistors 60 via the third cavities 57. In the first embodiment, the bump 40 (metal member) is connected to the unit transistors 60 via the third cavities 57. The rewiring 45 (metal member) in the fourth embodiment thus corresponds to the bump 40 (metal member) in the first embodiment. In the fourth embodiment, the region where the rewiring 45 overlaps each of the multiple sections formed by the first boundary lines 65 and the second boundary lines 66 is defined as a heat-dissipating range 67 of the effective operating region 62 within the corresponding section.

The bump 40 is disposed at a position at which it is displaced from the second-layer emitter wiring E2 in the x-axis direction. The rewiring 45 is connected to the second-layer emitter wiring E2 via the third cavities 57. Heat generated in the effective operating regions 62 is conducted to the rewiring 45 via the third cavities 57 and then reaches the bump 40 after being conducted through the rewiring 45 in the x-axis direction.

In the third embodiment, in each transistor group 63 (FIG. 4), the areas by which the heat-dissipating ranges 67 at both ends overlap the corresponding third cavities 57 are found to be smaller than the areas by which the other heat-dissipating ranges 67 overlap the corresponding third cavities 57. In the fourth embodiment, however, in each transistor group 63, the area by which the heat-dissipating range 67 only at one end close to the bump 40 overlaps the corresponding third cavity 57 is set to be smaller than the areas by which the other heat-dissipating ranges 67 overlap the third cavities 57.

In the fourth embodiment, as well as in the third embodiment, three third cavities 57 are disposed on the central first boundary line 65.

Advantages of the fourth embodiment will be discussed below.

In the fourth embodiment, as well as in the third embodiment, three third cavities 57 are disposed on the central first boundary line 65. This makes it possible to reduce temperature variations among the plural effective operating regions 62 in the y-axis direction. In the fourth embodiment, heat generated in the effective operating regions 62 is conducted to the rewiring 45 and reaches the bump 40, and is then dissipated from the bump 40 to the outside. With this configuration, the temperature of the effective operating region 62 positioned closer to the bump 40 is less likely to become high, while that positioned farther separated from the bump 40 is more likely to become high.

In the fourth embodiment, the area by which the heat-dissipating range 67 of the effective operating region 62 where the temperature is less likely to become high overlaps the third cavity 57 is set to be relatively small. This configuration makes it possible to reduce temperature variations among the plural effective operating regions 62 in the x-axis direction, as well as in the y-axis direction.

In the fourth embodiment, the position of the bump 40 is not fixed to that above the unit transistors 60 and may be rearranged by using the rewiring 45. This enhances the flexibility concerning the position of the bump 40 and accordingly increases the flexibility in mounting the semiconductor apparatus on a mounting substrate, for example. Additionally, the unit transistors 60 are less vulnerable to a stress generated in the bump 40.

Fifth Embodiment

A semiconductor apparatus according to a fifth embodiment will now be described below with reference to FIG. 6. An explanation of the elements configured similarly to those of the semiconductor apparatus according to the first embodiment (FIGS. 1 through 2B) will be omitted.

Figure 6:
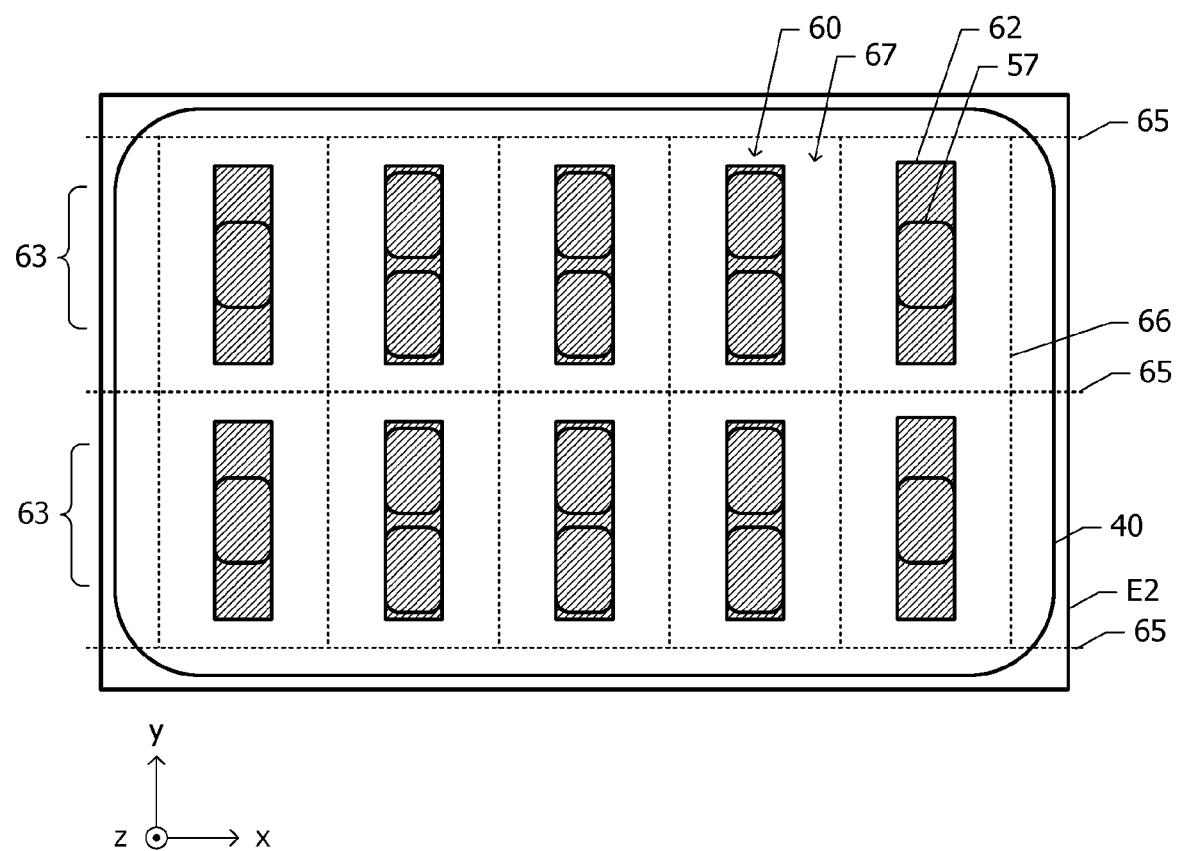
FIG. 6 is a plan view illustrating the positional relationships among plural unit transistors, effective operating regions, heat-dissipating ranges, a second-layer emitter wiring, a bump, and third cavities of a semiconductor apparatus according to a fifth embodiment.

FIG. 6 is a plan view illustrating the positional relationships among plural unit transistors 60, effective operating regions 62, heat-dissipating ranges 67, a second-layer emitter wiring E2, a bump 40, and third cavities 57 of the semiconductor apparatus according to the fifth embodiment. In the fifth embodiment, the positional relationship between the effective operating regions 62 and the third cavities 57 of one transistor group 63 is the same as that of the other transistor group 63. Focusing on the same transistor group 63, the positional relationship between the effective operating regions 62 and the third cavities 57 is identical to that of the outermost transistor groups 63 in the y-axis direction of the semiconductor apparatus according to the second embodiment.

Advantages of the fifth embodiment will be discussed below.

If there is no significant temperature variations among effective operating regions 62 located at different positions in the y-axis direction, the positional relationship between the effective operating regions 62 and the third cavities 57 may be fixed among multiple transistor groups 63, as in the fifth embodiment. This configuration can maintain the uniformity of the temperatures of the effective operating regions 62 in the y-axis direction.

It is also possible to reduce temperature variations among the plural effective operating regions 62 in the x-axis direction, as in the second embodiment (FIG. 3).

Sixth Embodiment

A semiconductor apparatus according to a sixth embodiment will now be described below with reference to FIGS. 7 and 8. An explanation of the elements configured similarly to those of the semiconductor apparatus according to the first embodiment (FIGS. 1 through 2B) will be omitted.

Figure 7:
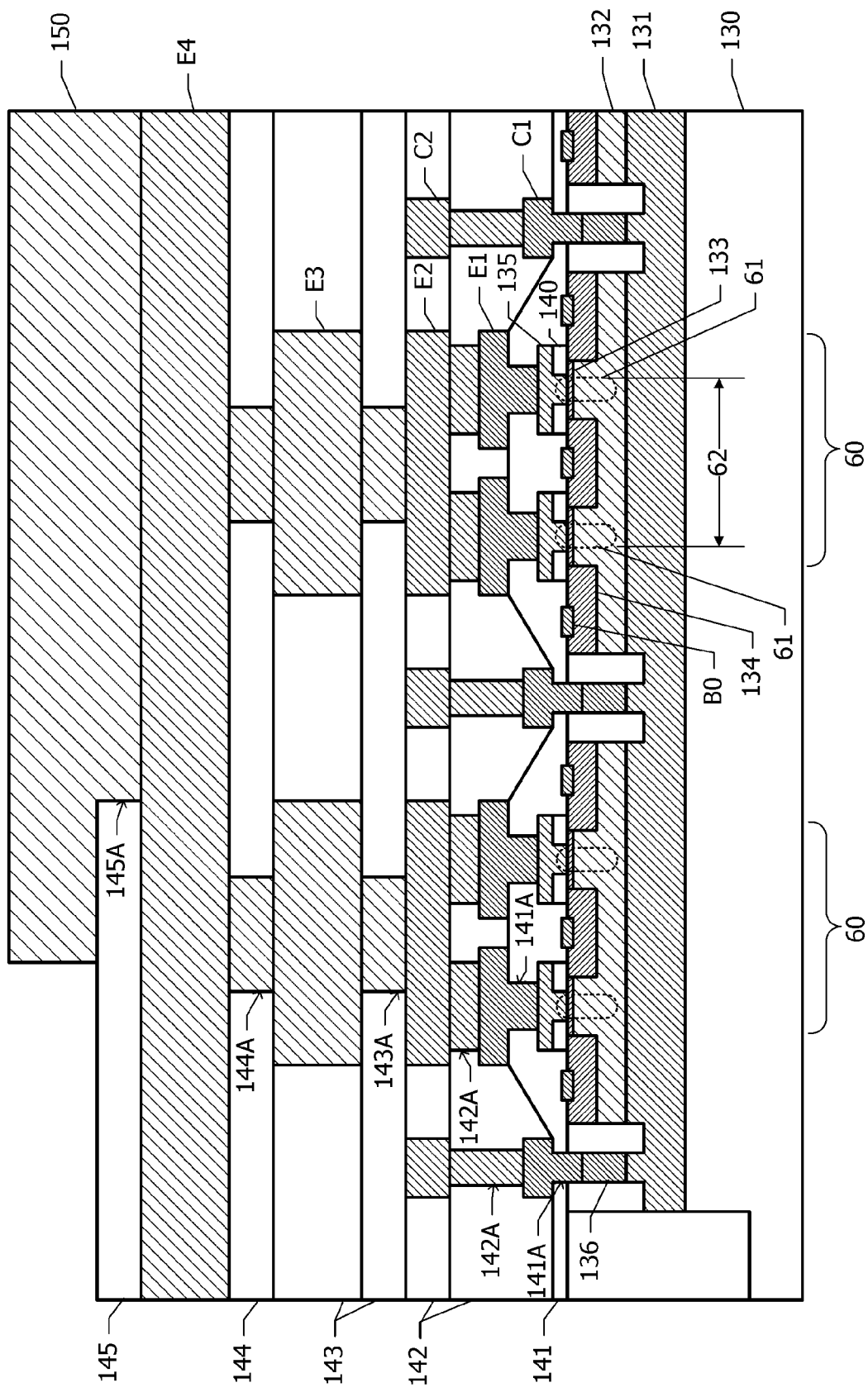
FIG. 7 is a sectional view illustrating part of a semiconductor apparatus according to a sixth embodiment.

FIG. 7 is a sectional view of part of the semiconductor apparatus according to the sixth embodiment. In the first embodiment, GaAs is used for the base layer 33 (FIG. 1), and InGaP is used for the intrinsic emitter layer 34A (FIG. 1). In the sixth embodiment, SiGe is used for a base layer, and Si is used for an emitter layer.

On the front side of a substrate 130 made of p-type Si, a sub-collector layer 131 made of high-concentration n-type Si is disposed, and a collector layer 132 made of n-type Si is disposed on the sub-collector layer 131. On the collector layer 132, base layers 133 made of epitaxially grown p-type SiGe are disposed.

Because of a shallow trench isolation structure in the areas from the top surfaces of the base layers 133 until the position somewhat deeper than the top surface of the sub-collector layer 131, multiple active regions are defined, and a unit transistor 60 is disposed in each of the active regions. Because of the shallow trench isolation structure which reaches the bottom surface of the sub-collector layer 131, the plural unit transistors 60 are electrically isolated from peripheral circuits. The cross-sectional view of FIG. 7 shows two unit transistors 60.

High-concentration p-type external base layers 134 are formed on the front side of part of each active region. The external base layers 134 surround the base layers 133 made of p-type SiGe, as viewed from above. In one active region, two base layers 133 are disposed.

An insulating film 140 made of silicon oxide, for example, is formed on each of the base layers 133, and an emitter layer 135 made of n-type polysilicon, for example, is disposed on the insulating film 140. The emitter layer 135 contacts the base layer 133 via a cavity formed in the insulating film 140. The operating current flows through a heterojunction interface between the emitter layer 135 and the base layer 133 in the thickness direction. The outer edge lines of this heterojunction interface define an operating region 61, as viewed from above. Each unit transistor 60 includes two operating regions 61. As in the first embodiment shown in FIG. 2A, an effective operating region 62 including two operating regions 61 as viewed from above is defined.

A base electrode B0 is disposed on the front surface of each external base layer 134. The base electrode B0 is made of metal silicide, such as Ti silicide or Ni silicide. The base electrode B0 is provided for reducing the base resistance. If the base resistance is sufficiently low without the base electrode B0, the provision of the base electrode B0 may be omitted.

A first-layer insulating film 141 made of silicon oxide, for example, is disposed to cover the emitter layers 135, the external base layers 134, and the base electrodes B0. First-layer emitter wirings E1 and first-layer collector wirings C1 made of A1, for example, are formed on the first-layer insulating film 141. Each first-layer emitter wiring E1 is electrically connected to the corresponding emitter layer 135 via a first cavity 141A formed in the first-layer insulating film 141. The first-layer collector wirings C1 are electrically connected to the collector layer 132 via other first cavities 141A formed in the first-layer insulating film 141 and high-concentration n-type regions 136 and the sub-connector layer 131 formed on the front surface of the substrate 130. To reduce the collector resistance, a collector electrode made of metal silicide may be disposed at the interface between the first-layer collector wiring C1 and the n-type region 136. Al, which is the material for the first-layer emitter wirings E1 and the first-layer collector wirings C1, or another metal, such as W, may be embedded in the first cavities 141A formed in the first-layer insulating film 141.

The base electrode B0 is connected to a first-layer base wiring at a portion which is not seen in the sectional view of FIG. 7.

A second-layer insulating film 142 made of silicon oxide or silicon nitride, for example, is disposed on the first-layer insulating film 141 so as to cover the first-layer emitter wirings E1 and the first-layer collector wirings C1. In the second-layer insulating film 142, wiring grooves and second cavities 142A are formed. One or multiple second cavities 142A are provided for each first-layer emitter wiring E1 and each first-layer collector wiring C1.

The second cavities 142A contain metal, such as W, embedded therein. The wiring grooves receive second-layer emitter wirings E2 and second-layer collector wirings C2 made of Cu for example, therein. Each second-layer emitter wiring E2 is electrically connected to the corresponding first-layer emitter wirings E1 via the metal embedded in the second cavities 142A, and connects the two emitter layers 135 of the corresponding unit transistor 60 with each other. Each second-layer collector wiring C2 is electrically connected to the corresponding first-layer collector wiring C1 via the metal within another second cavity 142A formed in the second-layer insulating film 142.

In the first embodiment, the first emitter cavities 51E (FIG. 1) and the second emitter cavities 54E (FIG. 1) are all located immediately above the emitter layers 34. In the sixth embodiment, the first cavities 141A and the second cavities 142A are all located immediately above the emitter layers 135. That is, the positions of the first and second emitter cavities 51E and 54E are determined by the positions of the emitter layers 34, and the positions of the first and second cavities 141A and 142A are determined by the positions of the emitter layers 135. The flexibility in arranging these cavities is small. From this point of view, the first and second cavities 141A and 142A in the sixth embodiment respectively correspond to the first and second emitter cavities 51E and 54E in the first embodiment.

In contrast, the third cavities 57 (FIG. 1) in the first embodiment and third cavities 143A and fourth cavities 144A in the sixth embodiment are not significantly restricted by the positions of the emitter layers 34 and 135. It is sufficient if the third cavities 57 are disposed within the second-layer emitter wiring E2 (FIG. 1) and the third and fourth cavities 143A and 144A are disposed within the corresponding second-layer emitter wiring E2 (FIG. 7) as viewed from above. The third and fourth cavities 143A and 144A in the sixth embodiment correspond to the third cavities 57 in the first embodiment.

On the second-layer insulating film 142 and the second-layer emitter wirings E2 and the second-layer collector wirings C2, a third-layer insulating film 143 made of silicon oxide or silicon nitride, for example, is disposed. In the third-layer insulating film 143, wiring grooves and the third cavities 143A are formed. One or multiple third cavities 143A are provided for each effective operating region 62.

The third cavities 143A contain a metal, such as W, embedded therein. The wiring grooves receive third-layer emitter wirings E3 made of Cu, for example, therein. Each third-layer emitter wiring E3 is connected to the corresponding second-layer emitter wiring E2 via the metal embedded in the third cavity 143A.

A fourth-layer insulating film 144 made of silicon oxide or silicon nitride, for example, is disposed on the third-layer insulating film 143 and the third-layer emitter wirings E3. In the fourth-layer insulating film 144, a wiring groove and fourth cavities 144A are formed. The fourth cavities 144A are located immediately above the third cavities 143A, and the third and fourth cavities 143A and 144A fit each other almost perfectly as viewed from above.

The fourth cavities 144A contain a metal, such as W, embedded therein. The wiring groove receives a fourth-layer emitter wiring E4 made of Cu, for example, therein. The fourth-layer emitter wiring E4 is connected to the third-layer emitter wirings E3 via the metal embedded in the fourth cavities 144A.

A fifth-layer insulating film 145 made of silicon oxide or silicon nitride, for example, is disposed on the fourth-layer insulating film 144 and the fourth-layer emitter wiring E4. A bump 150 is disposed on the fifth-layer insulating film 145.

The bump 150 is connected to the fourth-layer emitter wiring E4 via a fifth cavity 145A formed in the fifth-layer insulating film 145.

Heat generated in each effective operating region 62 is conducted to the top surface of the bump 150 via the emitter wirings E1, the metal embedded in the second cavities 142A, the second-layer emitter wiring E2, the metal embedded in the third cavity 143A, the third-layer emitter wiring E3, the metal embedded in the fourth cavity 144A, the fourth-layer emitter wiring E4, and the bump 150 in the fifth cavity 145A, and is dissipated to the outside.

The third-layer emitter wiring E3 is provided for each unit transistor 60. In contrast, the fourth-layer emitter wiring E4 is provided for multiple unit transistors 60. That is, the fourth-layer emitter wiring E4 connects multiple unit transistors 60 with each other. From this point of view, the fourth-layer emitter wiring E4 corresponds to the bump 40 (metal member) in the first embodiment (FIG. 1).

The top surfaces of the second-layer through fifth-layer insulating films 142 through 145 are flattened. The top surface of the first-layer insulating film 141 may also be flattened if necessary.

Figure 8:
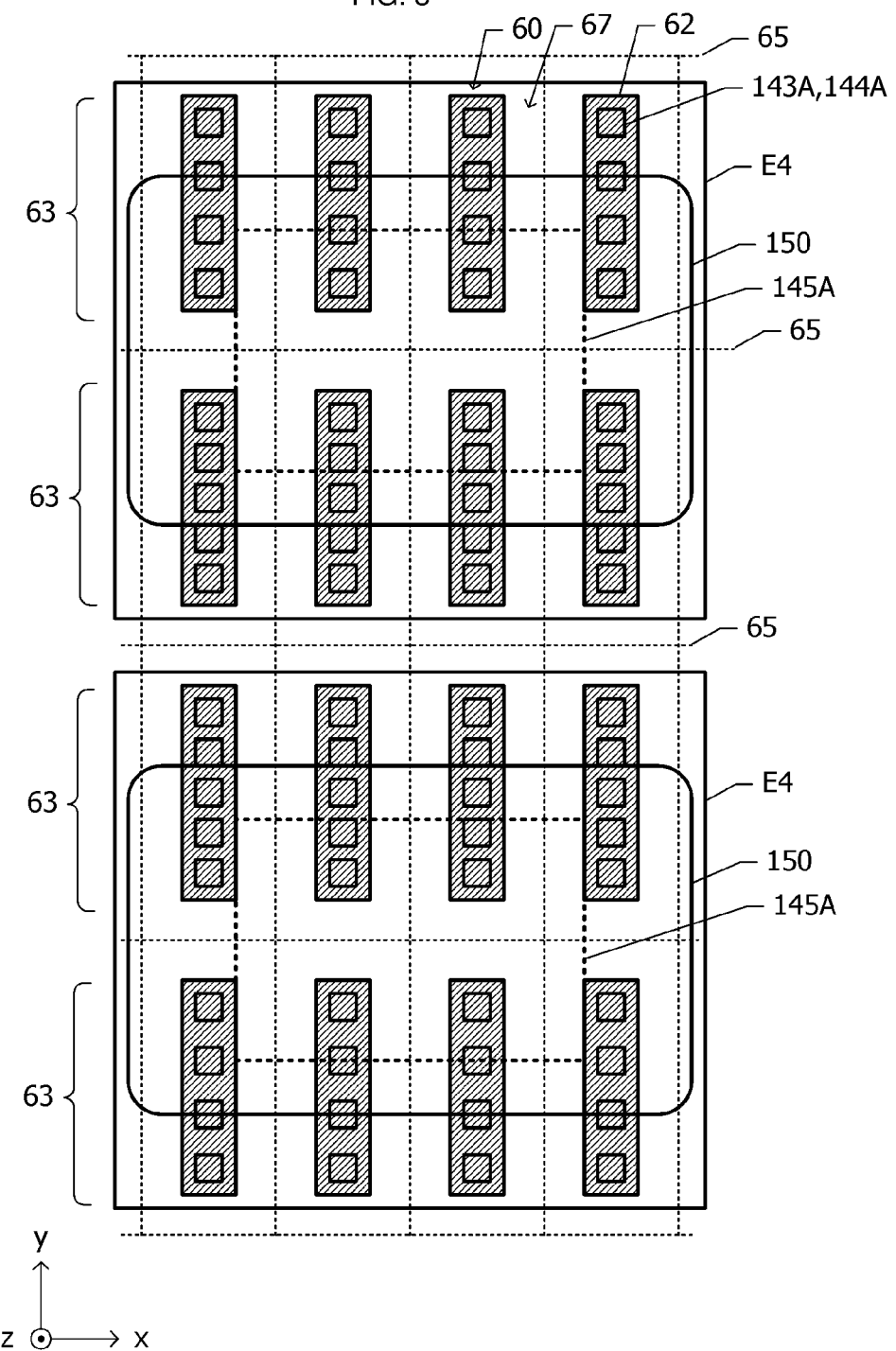
FIG. 8 is a plan view illustrating the positional relationships among plural unit transistors, effective operating regions, heat-dissipating ranges, fourth-layer emitter wirings, bumps, and third through fifth cavities of the semiconductor apparatus according to the sixth embodiment.

FIG. 8 is a plan view illustrating the positional relationships among plural unit transistors 60, effective operating regions 62, heat-dissipating ranges 67, fourth-layer emitter wirings E4, bumps 150, third cavities 143A, fourth cavities 144A, and fifth cavities 145A of the semiconductor apparatus according to the sixth embodiment. Four transistor groups 63 are arranged in the y-axis direction. Each transistor group 63 includes four unit transistors 60, that is, four effective operating regions 62. With this configuration, the plural effective operating regions 62 are equally arranged in a matrix of four rows and four columns, assuming that the row direction is the x-axis direction and the column direction is the y-axis direction. In a manner similar to the first embodiment, the heat-dissipating range 67 is defined for each effective operating region 62.

One fourth-layer emitter wiring E4 is located to contain the effective operating regions 62 of the first and second rows, and the other fourth-layer emitter wiring E4 is located to contain the effective operating regions 62 of the third and fourth rows. The fifth cavities 145A are disposed within the respective fourth-layer emitter wirings E4 as viewed from above. The two bumps 150 are disposed to contain the respective fifth cavities 145A.

The planar shape of the first and second transistor groups 63 and the related portions and that of the third and fourth transistor groups 63 and the related portions are mirror-symmetrical with each other with respect to a plane parallel with a zx plane.

First boundary lines 65 and second boundary lines 66 form multiple sections, as in the first embodiment. In the sixth embodiment, the region where the fourth-layer emitter wiring E4 (metal member) corresponding to the bump 40 in the first embodiment overlaps each of the multiple sections is defined as a heat-dissipating range 67 of the effective operating region 62 within the corresponding section. In FIG. 8, the upper edges of the heat-dissipating ranges 67 of the effective operating regions 62 in the first row are defined by the fourth-layer emitter wiring E4, and the lower edges thereof are defined by the first boundary line 65. The upper edges of the heat-dissipating ranges 67 of the effective operating regions 62 in the second row are defined by the first boundary line 65, and the lower edges thereof are defined by the fourth-layer emitter wiring E4.

The planar shape of each effective operating region 62 is a rectangle elongated in the y-axis direction. The third and fourth cavities 143A and 144A are located within the corresponding effective operating regions 62. For the outermost transistor groups 63 (first and fourth rows) in the y-axis direction, four third cavities 143A and four fourth cavities 144A are disposed for each effective operating region 62. For the inward positioned transistor groups 63 (second and third rows) in the y-axis direction, five third cavities 143A and five fourth cavities 144A are disposed for each effective operating region 62. The planar shape of the third and fourth cavities 143A and 144A is the same, and the area thereof is also the same. With this configuration, the areas by which the heat-dissipating ranges 67 in the relatively inward transistor groups 63 overlap the corresponding third and fourth cavities 143A and 144A are larger than the areas by which the heat-dissipating ranges 67 in the relatively outward transistor groups 63 overlap the corresponding third and fourth cavities 143A and 144A.

Advantages of the sixth embodiment will be discussed below.

In the sixth embodiment, the first cavities 141A and the second cavities 142A (FIG. 7) are formed in suitable sizes and are located at suitable positions in terms of the electrical characteristics of the semiconductor apparatus. The first-layer through fourth-layer emitter wirings E1 through E4 are disposed between the fifth-layer insulating film 145 and the unit transistors 60. Because of this configuration, the size and the position of the fifth cavity 145A are less likely to influence the distribution of heat dissipation characteristics of the plural effective operating regions 62. Additionally, the fourth-layer emitter wiring E4, which is a metal member contributing to enhancing the temperature uniformity, is formed thicker than the other wirings, thereby reducing the influence of the fifth cavity 145A on the heat dissipation characteristics. Adjusting the size and the positions of the third and fourth cavities 143A and 144A can largely control the heat dissipation characteristics of the corresponding effective operating region 62.

The temperature of the effective operating regions 62 of the relatively inward transistor groups 63 (second and third rows) in the y-axis direction is more likely to become high than that of the effective operating regions 62 of the relatively outward transistor groups 63 (first and fourth rows) in the y-axis direction. In the sixth embodiment, for the effective operating region 62 where the temperature is more likely to become high, the area by which the heat-dissipating range 67 of this effective operating region 62 overlaps the third and fourth cavities 143A and 144A is made relatively large. This can reduce the temperature variations among the effective operating regions 62 in the y-axis direction.

Modified examples of the sixth embodiment will be described below.

In the sixth embodiment, the third cavities 143A and the fourth cavities 144A almost perfectly fit each other as viewed from above. However, this arrangement is only an example. The number of only one of the third cavities 143A and the fourth cavities 144A for each effective operating region 62 may be adjusted. This can also contribute to reducing the temperature variations among the effective operating regions 62.

The numbers and the sizes of the first and second cavities 141A and 142A may be adjusted to such a degree as not to influence the electrical characteristics of the semiconductor apparatus. This arrangement can also contribute to reducing the temperature variations among the effective operating regions 62.

In the sixth embodiment, within the same transistor group 63, the area by which the plural heat-dissipating ranges 67 arranged in the x-axis direction overlap the corresponding third and fourth cavities 143A and 144A are equal to each other. As in the outermost transistor groups 63 in the x-axis direction in the second embodiment (FIG. 3), within the same transistor group 63, the areas by which the plural heat-dissipating ranges 67 overlap the corresponding third and fourth cavities 143A and 144A may be made different from each other. This can reduce the temperature variations among the effective operating regions 62 in the x-axis direction.

In the sixth embodiment, the shapes and the sizes of the third and fourth cavities 143A and 144A are uniform, and the numbers of third and fourth cavities 143A and 144A of the inward transistor groups 63 are different from those of the outward transistor groups 63. Alternatively, the shapes and the sizes of the third and fourth cavities 143A and 144A in one transistor group 63 may be made different from those in another transistor group 63.

In the sixth embodiment, the semiconductor apparatus is divided into two patterns in which one fourth-layer emitter wiring E4 is provided for the transistor groups 63 in the first and second rows and the other fourth-layer emitter wiring E4 is provided for the transistor groups 63 in the third and fourth rows. Instead of this configuration, the semiconductor apparatus may be formed in one pattern in which only one fourth-layer emitter wiring E4 covers the transistor groups 63 in the first through fourth rows.

In the sixth embodiment, the fourth-layer emitter wiring E4 is larger than the third-layer emitter wiring E3. The third-layer and fourth-layer emitter wirings E3 and E4 may alternatively have the same planar shape, and the temperature uniformity may be achieved by using both the third-layer and fourth-layer emitter wirings E3 and E4. This can promote the temperature uniformity in the in-planar direction.

To avoid the temperature nonuniformity caused by the fifth cavity 145A, the fifth cavity 145A may expand to contain the effective operating regions 62 in the first and second rows therein, or may shrink not to overlap the effective operating regions 62 in the first and second rows.

Seventh Embodiment

A semiconductor apparatus according to a seventh embodiment will now be described below with reference to FIG. 9. An explanation of the elements configured similarly to those of the semiconductor apparatus according to the sixth embodiment (FIGS. 7 and 8) will be omitted.

Figure 9:
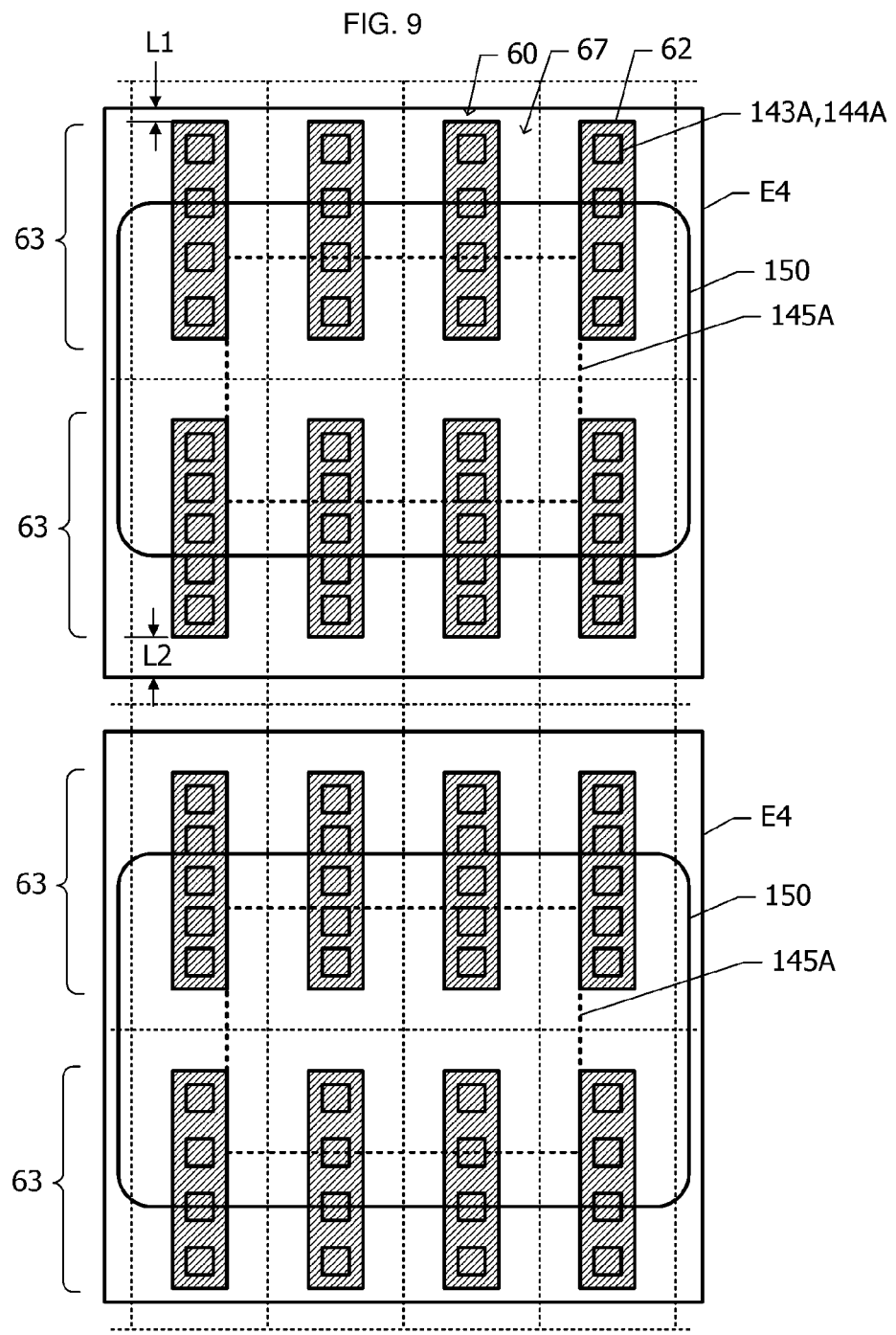
FIG. 9 is a plan view illustrating the positional relationships among plural unit transistors, effective operating regions, heat-dissipating ranges, fourth-layer emitter wirings, bumps, and third through fifth cavities of a semiconductor apparatus according to a seventh embodiment.

FIG. 9 is a plan view illustrating the positional relationships among plural unit transistors 60, effective operating regions 62, heat-dissipating ranges 67, fourth-layer emitter wirings E4, bumps 150, third cavities 143A, fourth cavities 144A, and fifth cavities 145A of the semiconductor apparatus according to the seventh embodiment. In the sixth embodiment, multiple heat-dissipating ranges 67 have the identical size. In contrast, in the seventh embodiment, the heat-dissipating ranges 67 of the relatively inward transistor groups 63 in the y-axis direction (second and third rows) are larger than those of the relatively outward transistor groups 63 in the y-axis direction (first and fourth rows).

To realize this configuration, the following arrangement is made. The distance L2 from the inner edges of the effective operating regions 62 of the transistor group 63 in the second row (the edges of the effective operating regions closer to the third row) to one edge of the fourth-layer emitter wiring E4 is made larger than the distance L1 from the outer edges of the effective operating regions 62 of the transistor group 63 in the first row to the other edge of the fourth-layer emitter wiring E4. This arrangement further improves heat dissipation from the effective operating regions 62 of the relatively inward transistor group 63 in the second row. The positional relationship between the transistor groups in the third and fourth rows and the fourth-layer emitter wiring E4 is similar to that between the transistor groups in the first and second rows and the fourth-layer emitter wiring E4.

Advantages of the seventh embodiment will be discussed below.

In the seventh embodiment, the heat-dissipating ranges 67 of the relatively inward transistor groups 63 (second and third rows) are made larger than those of the relatively outward transistor groups 63. This can further improve heat dissipation from the effective operating regions 62 of the relatively inward transistor groups 63. The fourth-layer emitter wiring E4 (metal member) corresponding to the larger heat-dissipating ranges 67 can receive heat conducted from the effective operating regions 62 at a lower thermal resistance. If the temperature variations among the effective operating regions 62 are not sufficiently reduced in the semiconductor apparatus of the sixth embodiment, the configuration of the semiconductor apparatus of the seventh embodiment may effectively be utilized.

Eighth Embodiment

A semiconductor apparatus according to an eighth embodiment will now be described below with reference to FIG. 10. An explanation of the elements configured similarly to those of the semiconductor apparatus according to the first embodiment (FIGS. 1 through 2B) will be omitted.

Figure 10:
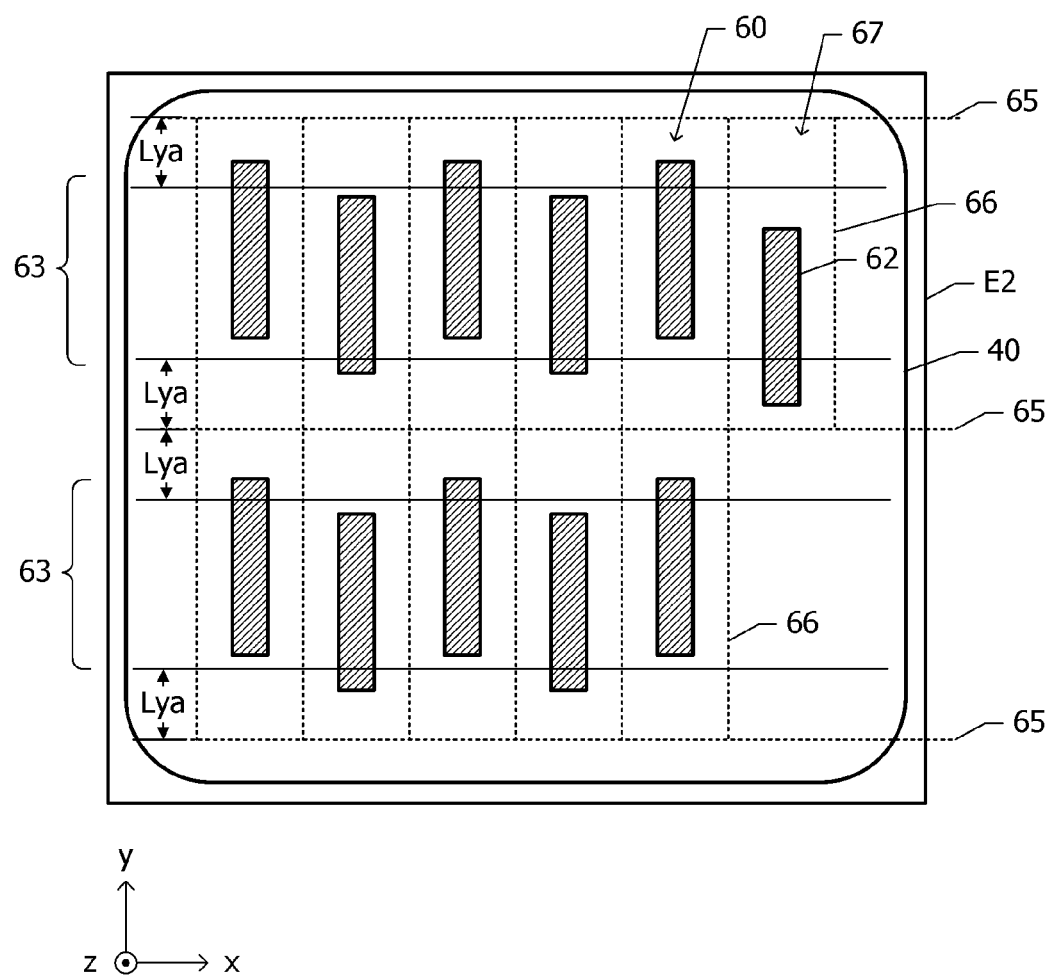
FIG. 10 is a plan view illustrating the positional relationships among plural unit transistors, effective operating regions, heat-dissipating ranges, a second-layer emitter wiring, and a bump of a semiconductor apparatus according to an eighth embodiment.

FIG. 10 is a plan view illustrating the positional relationships among plural unit transistors 60, effective operating regions 62, heat-dissipating ranges 67, a second-layer emitter wiring E2, and a bump 40 of the semiconductor apparatus according to the eighth embodiment. In the first embodiment, within the same transistor group 63 (FIG. 2B), the plural effective operating regions 62 are located at the same position in the y-axis direction. The distance Ly from the first boundary line 65 to each of the plural effective operating regions 62 is identical within the same transistor group 63. In contrast, in the eighth embodiment, within the same transistor group 63, the positions of the plural effective operating regions 62 in the y-axis direction are not uniform.

The first boundary line 65 between two transistor groups 63 is defined at a position at which the average distance Lya from the first boundary line 65 to the plural effective operating regions 62 of one transistor group 63 becomes equal to the average distance Lya from the first boundary line 65 to the plural effective operating regions 62 of the other transistor group 63. The outermost first boundary lines 65 are each defined at a position at which the average distance Lya from the outermost first boundary line 65 to the plural effective operating regions 62 of the outermost transistor group 63 becomes equal to the average distance Lya from the first boundary line 65 (central first boundary line in FIG. 10) positioned one line inward from the outermost first boundary line 65 to the plural effective operating regions 62 of the outermost transistor group 63. The second boundary lines 66 are defined similarly to those in the first embodiment.

In the eighth embodiment, as well as in the first embodiment (FIG. 2A), as a result of adjusting the positional relationship between the heat-dissipating ranges 67 and the third cavities 57 (FIG. 1), temperature variations among the effective operating regions 62 can be reduced.

Ninth Embodiment

A semiconductor apparatus according to a ninth embodiment will now be described below with reference to FIG. 11. An explanation of the elements configured similarly to those of the semiconductor apparatus according to the first embodiment (FIGS. 1 through 2B) will be omitted.

Figure 11:
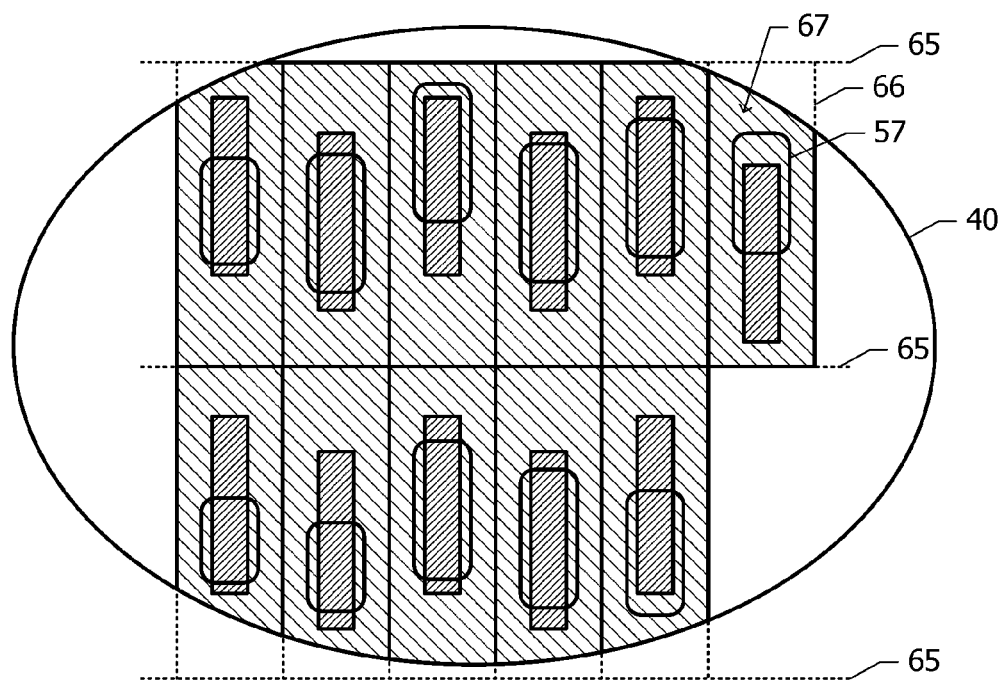
FIG. 11 is a plan view illustrating the positional relationships among effective operating regions, heat-dissipating ranges, third cavities, and a bump of a semiconductor apparatus according to a ninth embodiment.

FIG. 11 is a plan view illustrating the positional relationships among effective operating regions 62, heat-dissipating ranges 67, third cavities 57, and a bump 40 of the semiconductor apparatus according to the ninth embodiment. In the first embodiment, multiple sections formed by the first boundary lines 65 and the second boundary lines 66 are almost entirely contained within the bump 40, as viewed from above. These multiple sections thus coincide with the heat-dissipating ranges 67. In contrast, in the ninth embodiment, some of the multiple sections formed by the first boundary lines 65 and the second boundary lines 66 partially extend to outside the bump 40, as viewed from above. The portions extending to outside the bump 40, that is, the portions which do not overlap the bump 40, are not included in the heat-dissipating ranges 67. These portions are not likely to efficiently function as a heat transfer path for dissipating heat generated in the corresponding effective operating regions 62 to the outside via the bump 40, and are thus excluded from the heat-dissipating ranges 67. The heat-dissipating ranges 67 are indicated by the hatched portions in FIG. 11.

As a result of defining the heat-dissipating ranges 67 as described above, the area of the heat-dissipating range 67 and the area by which the heat-dissipating range 67 overlaps the corresponding third cavity 57 can be made different among the effective operating regions 62. It is thus possible to adjust the thermal resistance of the heat transfer path 59 from the corresponding effective operating region 62 to the top surface of the bump 40 and to control the amount of heat dissipation, thereby improving the characteristics of the semiconductor apparatus.

The disclosure is not limited to the above-described embodiments and modified examples. The configurations described in some of the embodiments and modified examples may partially be replaced by or combined with each other. Similar advantages obtained by similar configurations in plural embodiments are not repeated in the individual embodiments.

While preferred embodiments of the disclosure have been described above, it is to be understood that variations, improvements, combinations, and modifications will be apparent to those skilled in the art without departing from the scope and spirit of the disclosure. The scope of the disclosure, therefore, is to be determined solely by the following claims.

What is claimed is:

1. A semiconductor apparatus comprising:
   a substrate;
   a plurality of transistor groups disposed on the substrate, each of the plurality of transistor groups including
      a plurality of unit transistors arranged in a first direction within a plane of a top surface of the substrate, the plurality of unit transistors respectively comprising a collector layer and an emitter layer disposed on the substrate, an emitter electrode disposed on the emitter layer, and an emitter wiring connected to the emitter electrode, the plurality of transistor groups being arranged in a second direction perpendicular to the first direction,
      a collector electrode disposed between the unit transistors adjacent to each other in the first direction and connected to the collector layer,
      a first insulating film that covers the respective collector electrode for each of the plurality of unit transistors, and
      a collector wiring disposed over the collector electrode and including a first surface connected to the collector electrode and a second surface that is opposite to the first surface, the second surface being located above a top surface of the first insulating film,
   a second insulating film that covers the plurality of unit transistors and includes at least one cavity that is formed in the second insulating film and overlaps the emitter wiring in plan view, the second insulating film covering at least a portion of the second surface of the collector wiring, and
   a metal member that is disposed on the second insulating film and is electrically connected to the plurality of unit transistors via the at least one cavity, wherein
   a heat transfer path is formed by a metal in a region from each of the plurality of unit transistors forming a plurality of heat transfer paths through the at least one cavity to a top surface of the metal member, and thermal resistance values of the heat transfer paths are different from each other among the plurality of unit transistors.

2. The semiconductor apparatus according to claim 1, wherein:
   each of the plurality of unit transistors includes an operating region through which an operating current of a corresponding unit transistor flows, and a smallest rectangle including the operating region therein and having sides parallel with the first direction as viewed from above is defined as an effective operating region of a corresponding unit transistor;
   a first boundary line is defined, in the second direction, between each respective adjacent transistor group, and a line positioned outward of each of outermost transistor groups positioned most outwardly in the second direction is defined as an outermost first boundary line, each of the first boundary lines being parallel with the first direction, and, for each of the plurality of transistor groups, a second boundary line is defined, in the first direction, between two unit transistors of the respective transistor group and a line positioned outward of each of outermost unit transistors positioned most outwardly in the first direction is defined as an outermost second boundary line, the second boundary lines being parallel with the second direction, the first boundary lines and the second boundary lines forming a plurality of sections, and a range by which each of the plurality of sections overlaps the metal member as viewed from above is defined as a heat-dissipating range corresponding to the effective operating region contained within a corresponding section;
   each first boundary line between adjacent transistor groups is defined at a position at which an average distance from the respective first boundary line to the effective operating regions of one transistor group becomes equal to an average distance from the first boundary line to the effective operating regions of another transistor group;

the outermost first boundary line is defined at a position at which an average distance from the outermost first boundary line to the effective operating regions of the outermost transistor group becomes equal to an average distance from the first boundary line positioned one line inward from the outermost first boundary line to the effective operating regions of the outermost transistor group;

each second boundary line between adjacent unit transistors is defined at a position at which a distance from the respective second boundary line to the effective operating region of one unit transistor becomes equal to a distance from the second boundary line to the effective operating region of an other unit transistor;

for each of the plurality of transistor groups, the outermost second boundary line is defined at a position at which a distance from the effective operating region of the outermost unit transistor to the outermost second boundary line becomes equal to a distance from the effective operating region of the outermost unit transistor to another second boundary line adjacent to the outermost second boundary line; and the thermal resistance values of the heat transfer paths are different from each other among the plurality of unit transistors by a first structure or a second structure, the first structure being a structure in which, in at least one pair of two adjacent heat-dissipating ranges in the second direction, an area by which one heat-dissipating range overlaps a corresponding cavity is different from an area by which the other heat-dissipating range overlaps a corresponding cavity, the second structure being a structure in which, in at least one pair of two adjacent heat-dissipating ranges in the second direction, an area of one heat-dissipating range and an area of the other heat-dissipating range are different from each other.

3. The semiconductor apparatus according to claim 2, wherein
the plurality of transistor groups are arranged in three or more columns in the second direction, and an area by which the heat-dissipating range positioned relatively inward in the second direction overlaps a corresponding cavity is larger than an area by which the heat-dissipating range positioned relatively outward in the second direction overlaps a corresponding cavity, or an area of the heat-dissipating range positioned relatively inward in the second direction is larger than an area of the heat-dissipating range positioned relatively outward in the second direction.

4. The semiconductor apparatus according to claim 3, wherein
the plurality of transistor groups are arranged in three or more columns in the second direction, and more unit transistors are included in the outermost transistor groups than in another transistor group.

5. The semiconductor apparatus according to claim 2, wherein
the plurality of transistor groups are arranged in three or more columns in the second direction, and more unit transistors are included in the outermost transistor groups than in another transistor group.

6. The semiconductor apparatus according to claim 4, wherein,
among the heat-dissipating ranges in at least one of the plurality of transistor groups, an area by which a heat-dissipating range overlaps a corresponding cavity is different from an area by which another heat-dissipating range overlaps a corresponding cavity, or areas of the heat-dissipating ranges are different from each other.

7. The semiconductor apparatus according to claim 3, wherein,
among the heat-dissipating ranges in at least one of the plurality of transistor groups, an area by which a heat-dissipating range overlaps a corresponding cavity is different from an area by which another heat-dissipating range overlaps a corresponding cavity, or areas of the heat-dissipating ranges are different from each other.

8. The semiconductor apparatus according to claim 5, wherein,
among the heat-dissipating ranges in at least one of the plurality of transistor groups, an area by which a heat-dissipating range overlaps a corresponding cavity is different from an area by which another heat-dissipating range overlaps a corresponding cavity, or areas of the heat-dissipating ranges are different from each other.

9. The semiconductor apparatus according to claim 2, wherein,
among the heat-dissipating ranges in at least one of the plurality of transistor groups, an area by which a heat-dissipating range overlaps a corresponding cavity is different from an area by which another heat-dissipating range overlaps a corresponding cavity, or areas of the heat-dissipating ranges are different from each other.

10. The semiconductor apparatus according to claim 4, wherein
the metal member is a bump.

11. The semiconductor apparatus according to claim 3, wherein
the metal member is a bump.

12. The semiconductor apparatus according to claim 5, wherein
the metal member is a bump.

13. The semiconductor apparatus according to claim 9, wherein
the metal member is a bump.

14. The semiconductor apparatus according to claim 2, wherein
the metal member is a bump.

15. The semiconductor apparatus according to claim 1, wherein
the metal member is a bump.

16. The semiconductor apparatus according to claim 3, wherein
the metal member is wiring or rewiring, the rewiring being used for rearranging a position of an external connection terminal.

17. The semiconductor apparatus according to claim 5, wherein
the metal member is wiring or rewiring, the rewiring being used for rearranging a position of an external connection terminal.

18. The semiconductor apparatus according to claim 9, wherein
the metal member is wiring or rewiring, the rewiring being used for rearranging a position of an external connection terminal.

19. The semiconductor apparatus according to claim 2, wherein the metal member is wiring or rewiring, the rewiring being used for rearranging a position of an external connection terminal.

20. The semiconductor apparatus according to claim 1, wherein
the metal member is wiring or rewiring, the rewiring being used for rearranging a position of an external connection terminal.

21. The semiconductor apparatus according to claim 1, wherein
the second insulating film comprises a first-layer insulating film which covers at least a portion of the second surface of the collector wiring and a second-layer insulating film which is disposed on the first-layer insulating film and covers at least a portion of the emitter wiring.

22. A semiconductor apparatus comprising:
a substrate;
a plurality of transistor groups disposed on the substrate, each of the plurality of transistor groups including
a plurality of unit transistors arranged in a first direction within a plane of a top surface of the substrate, the plurality of transistor groups being arranged in a second direction perpendicular to the first direction,
an insulating film that covers the plurality of unit transistors and includes at least one cavity; and
a metal member that is disposed on the insulating film and is electrically connected to the plurality of unit transistors via the at least one cavity, wherein
a heat transfer path is formed by a metal in a region from each of the plurality of unit transistors forming a plurality of heat transfer paths to a top surface of the metal member, and thermal resistance values of the heat transfer paths are different from each other among the plurality of unit transistors,
each of the plurality of unit transistors includes an operating region through which an operating current of a corresponding unit transistor flows, and a smallest rectangle including the operating region therein and having sides parallel with the first direction as viewed from above is defined as an effective operating region of a corresponding unit transistor;
a first boundary line is defined, in the second direction, between each respective adjacent transistor group, and a line positioned outward of each of outermost transistor groups positioned most outwardly in the second direction is defined as an outermost first boundary line, each of the first boundary lines being parallel with the first direction, and, for each of the plurality of transistor groups, a second boundary line is defined, in the first direction, between two unit transistors of the respective transistor group and a line positioned outward of each of outermost unit transistors positioned most outwardly in the first direction is defined as an outermost second boundary line, the second boundary lines being parallel with the second direction, the first boundary lines and the second boundary lines forming a plurality of sections, and a range by which each of the plurality of sections overlaps the metal member as viewed from above is defined as a heat-dissipating range corresponding to the effective operating region contained within a corresponding section;
each first boundary line between adjacent transistor groups is defined at a position at which an average distance from the respective first boundary line to the effective operating regions of one transistor group becomes equal to an average distance from the first boundary line to the effective operating regions of an other transistor group;
the outermost first boundary line is defined at a position at which an average distance from the outermost first boundary line to the effective operating regions of the outermost transistor group becomes equal to an average distance from the first boundary line positioned one line inward from the outermost first boundary line to the effective operating regions of the outermost transistor group;
each second boundary line between adjacent unit transistors is defined at a position at which a distance from the respective second boundary line to the effective operating region of one unit transistor becomes equal to a distance from the second boundary line to the effective operating region of an other unit transistor;
for each of the plurality of transistor groups, the outermost second boundary line is defined at a position at which a distance from the effective operating region of the outermost unit transistor to the outermost second boundary line becomes equal to a distance from the effective operating region of the outermost unit transistor to another second boundary line adjacent to the outermost second boundary line; and
the thermal resistance values of the heat transfer paths are different from each other among the plurality of unit transistors by a first structure or a second structure, the first structure being a structure in which, in at least one pair of two adjacent heat-dissipating ranges in the second direction, an area by which one heat-dissipating range overlaps a corresponding cavity is different from an area by which the other heat-dissipating range overlaps a corresponding cavity, the second structure being a structure in which, in at least one pair of two adjacent heat-dissipating ranges in the second direction, an area of one heat-dissipating range and an area of the other heat-dissipating range are different from each other.

* * * * *